US011824429B2

(12) United States Patent
Sasao et al.

(10) Patent No.: US 11,824,429 B2
(45) Date of Patent: Nov. 21, 2023

(54) MULTI-PHASE STEP-DOWN DC/DC POWER SOURCE DEVICE

(71) Applicant: Sony Interactive Entertainment Inc., Tokyo (JP)

(72) Inventors: Kazuki Sasao, Tokyo (JP); Masanori Hayashibara, Tokyo (JP); Hideki Ito, Chiba (JP)

(73) Assignee: Sony Interactive Entertainment Inc., Tokyo (JP)

( * ) Notice: Subject to any disclaimer, the term of this patent is extended or adjusted under 35 U.S.C. 154(b) by 253 days.

(21) Appl. No.: 17/283,738

(22) PCT Filed: Oct. 18, 2019

(86) PCT No.: PCT/JP2019/041099
§ 371 (c)(1),
(2) Date: Apr. 8, 2021

(87) PCT Pub. No.: WO2020/080527
PCT Pub. Date: Apr. 23, 2020

(65) Prior Publication Data
US 2021/0328513 A1    Oct. 21, 2021

(30) Foreign Application Priority Data

Oct. 19, 2018 (JP) .................. 2018-197716

(51) Int. Cl.
*H02M 3/158* (2006.01)
*H02M 1/084* (2006.01)
*H05K 1/02* (2006.01)

(52) U.S. Cl.
CPC ......... *H02M 3/1584* (2013.01); *H02M 1/084* (2013.01); *H05K 1/0231* (2013.01);
(Continued)

(58) Field of Classification Search
None
See application file for complete search history.

(56) References Cited

U.S. PATENT DOCUMENTS 4,739,919 A   4/1988 Van Den Brekel
4,761,881 A   8/1988 Bora
(Continued)

FOREIGN PATENT DOCUMENTS

CN          1505456 A        6/2004
CN          207573821 U      7/2018
(Continued)

OTHER PUBLICATIONS

Extended European Search Report for related EP Application No. 19872843.8, 8 pages, dated Jun. 7, 2022.
(Continued)

*Primary Examiner* — Jeffrey A Gblende
(74) *Attorney, Agent, or Firm* — Matthew B. Dernier, Esq.

(57) ABSTRACT

A DC/DC converter includes N inductors and N power modules which correspond to N phases. The N inductors each include a plurality of inductor chips that are electrically connected in parallel to each other. The plurality of inductor chips are mounted separately on a main mounting surface and a sub-mounting surface of a printed circuit board. The sub-mounting surface is opposite to the main mounting surface.

6 Claims, 25 Drawing Sheets

(52) U.S. Cl.
CPC ............. *H05K 2201/10166* (2013.01); *H05K 2201/10507* (2013.01)

(56) References Cited

U.S. PATENT DOCUMENTS

| | | | |
|---|---|---|---|
| 5,373,984 | A | 12/1994 | Wentworth |
| 6,363,847 | B1 | 4/2002 | Murakami |
| 7,350,175 | B2 * | 3/2008 | Iwaki .................. G06F 30/367 716/137 |
| 7,606,038 | B2 | 10/2009 | Sugimura |
| 8,052,035 | B2 | 11/2011 | Cheng |
| 9,231,478 | B2 | 1/2016 | Sasao |
| 9,960,681 | B2 * | 5/2018 | Sedlak ................ H02M 3/1584 |
| 10,361,631 | B2 * | 7/2019 | Zhou ...................... H05K 1/181 |
| 10,505,456 | B1 * | 12/2019 | Zhang ................. H02M 3/1584 |
| 10,693,378 | B2 * | 6/2020 | Zhou ................... H02M 3/1584 |
| 11,647,593 | B2 | 5/2023 | Sasao |
| 2008/0186682 | A1 | 8/2008 | Sugimura |
| 2009/0108821 | A1 * | 4/2009 | Standing ............ H02M 3/1584 323/272 |
| 2011/0169471 | A1 * | 7/2011 | Nagasawa ............... H01L 24/84 323/283 |
| 2013/0200869 | A1 | 8/2013 | Sasao |
| 2014/0111172 | A1 | 4/2014 | Sasao |
| 2015/0008890 | A1 | 1/2015 | Sasao |
| 2016/0105983 | A1 | 4/2016 | Cho |
| 2017/0093285 | A1 | 3/2017 | Sasao |
| 2017/0117213 | A1 | 4/2017 | Cho |
| 2017/0317591 | A1 | 11/2017 | Sedlak |
| 2018/0145594 | A1 | 5/2018 | Akre |
| 2018/0231932 | A1 | 8/2018 | Minobe |
| 2020/0099304 | A1 | 3/2020 | Sasao |
| 2020/0260586 | A1 | 8/2020 | Hong |
| 2021/0066170 | A1 | 3/2021 | Ji |
| 2021/0143141 | A1 | 5/2021 | Bai |
| 2021/0328513 | A1 | 10/2021 | Sasao |

FOREIGN PATENT DOCUMENTS

| | | |
|---|---|---|
| CN | 111952293 A | 11/2020 |
| EP | 3007342 A1 | 4/2016 |
| EP | 3078108 B1 | 8/2018 |
| JP | 01236693 A | 9/1989 |
| JP | 0357295 A | 3/1991 |
| JP | 6334323 A | 12/1994 |
| JP | 794619 A | 4/1995 |
| JP | 2008078271 A | 4/2008 |
| JP | 2009159704 A | 7/2009 |
| JP | 2010124570 A | 6/2010 |
| JP | 2013222841 A | 10/2013 |
| JP | 2015015785 A | 1/2015 |
| JP | 2015079778 A | 4/2015 |
| JP | 2016067164 A | 4/2016 |
| JP | 2017112147 A | 6/2017 |
| JP | 2018506259 A | 3/2018 |

OTHER PUBLICATIONS

International Preliminary Report on Patentability and Written Opinion for corresponding PCT Application No. PCT/JP2019/041099, 11 pages, dated Apr. 29, 2021.
International Preliminary Report on Patentability and Written Opinion for related PCT Application No. PCT/JP2019/041097, 14 pages, dated Apr. 29, 2021.
International Preliminary Report on Patentability and Written Opinion for related PCT Application No. PCT/JP2019/041098, 14 pages, dated Apr. 29, 2021.
International Search Report for corresponding PCT Application No. PCT/JP2019/041099, 4 pages, dated Dec. 24, 2019.
Decision to Grant a Patent for related JP Application No. 2018-197714, 5 pages, dated Jun. 30, 2022.
Extended European Search Report for corresponding EP Application No. 19873866.8, 8 pages, dated Jun. 13, 2022.
International Search Report for corresponding PCT Application No. PCT/JP2019/041097, 2 pages, dated Dec. 10, 2019.
International Search Report for corresponding PCT Application No. PCT/JP2019/041098, 4 pages, dated Dec. 17, 2019.
Notice of Reasons for Refusal for related JP Application No. 2018-1197715, 8 pages, dated Aug. 23, 2022.
Office Action for related CN Application No. 201980067237.2, 14 pages, dated May 22, 2023.
Office Action for corresponding CN Application No. 201980067251.2, 14 pages, dated May 22, 2023.

* cited by examiner

FIG. 2
(a)
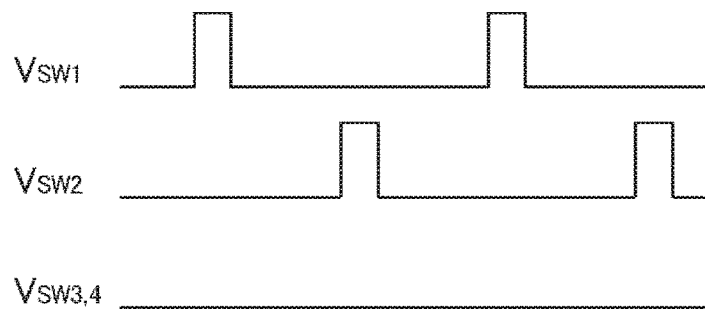
(b)
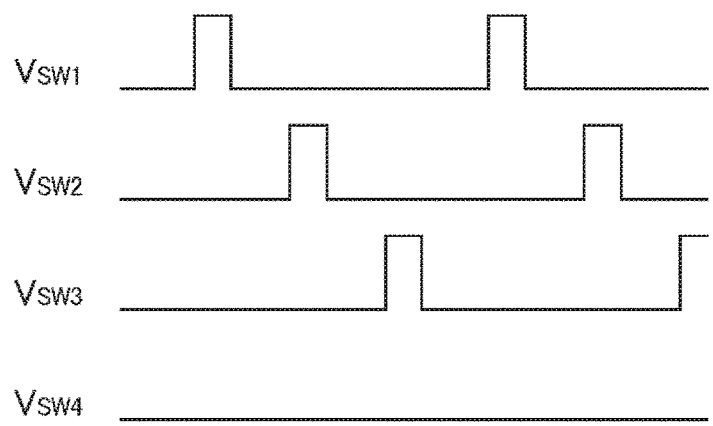
(c)
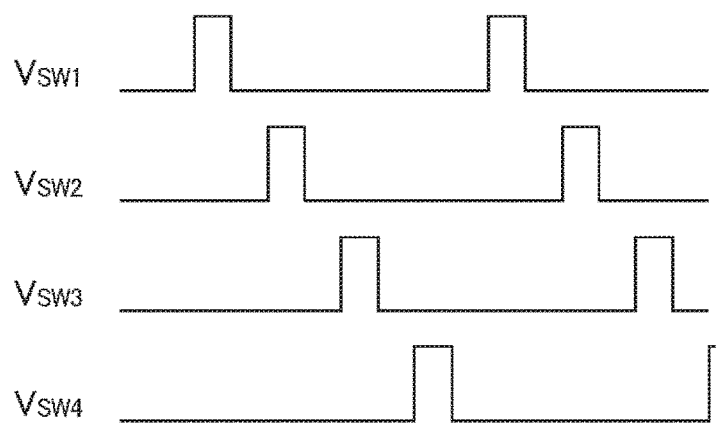

FIG.3
(a) 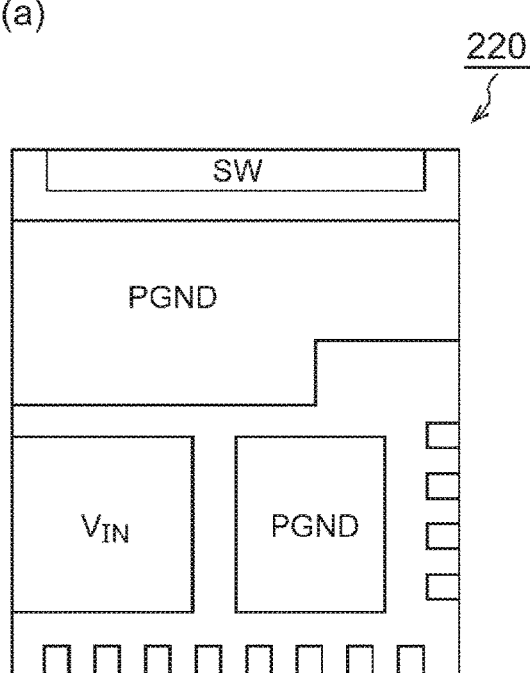
TOPVIEW
(b) 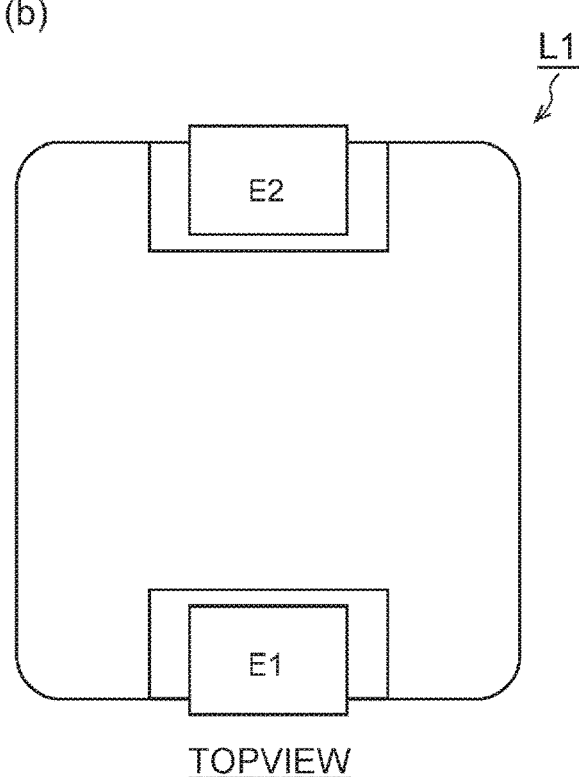
TOPVIEW

FIG.9
(a)
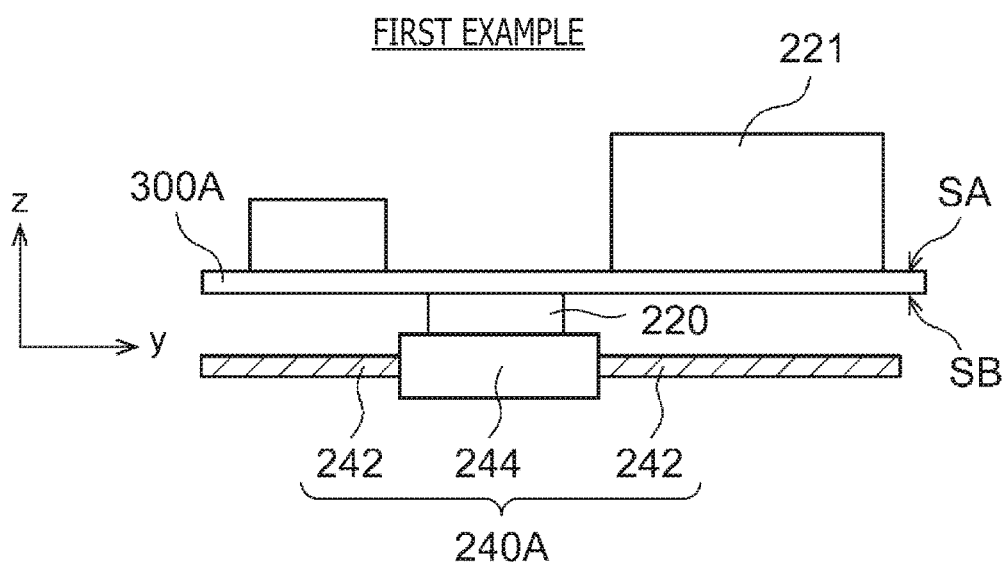
FIRST EXAMPLE
(b)
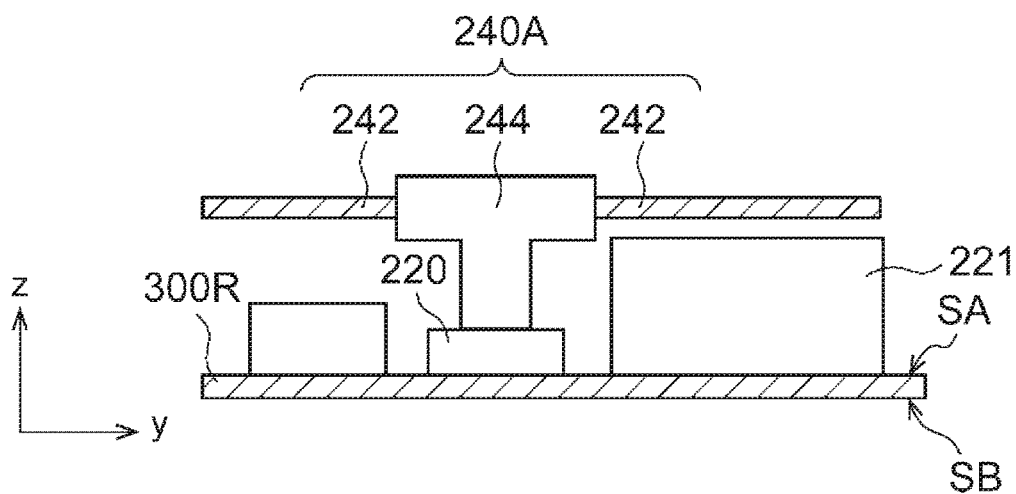
COMPARATIVE TECHNOLOGY

FIG.10
(a) FIRST EXAMPLE
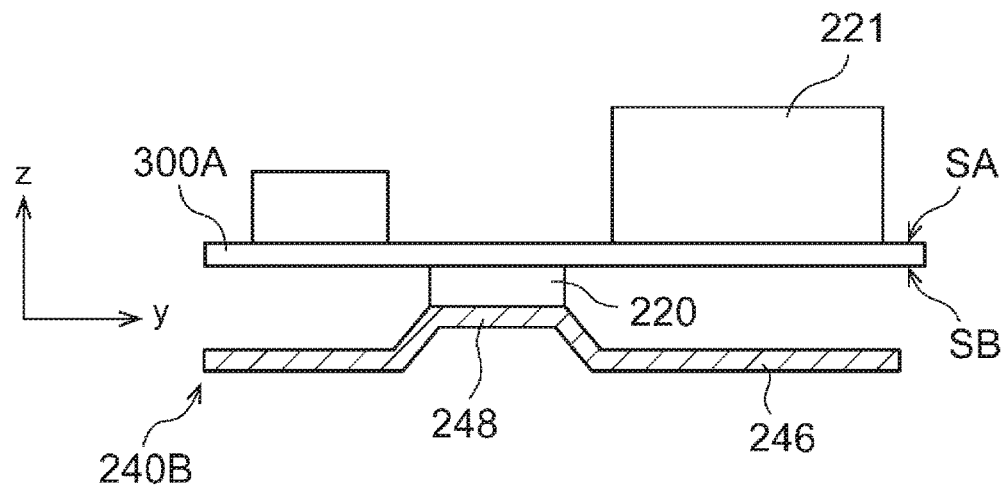
(b) COMPARATIVE TECHNOLOGY
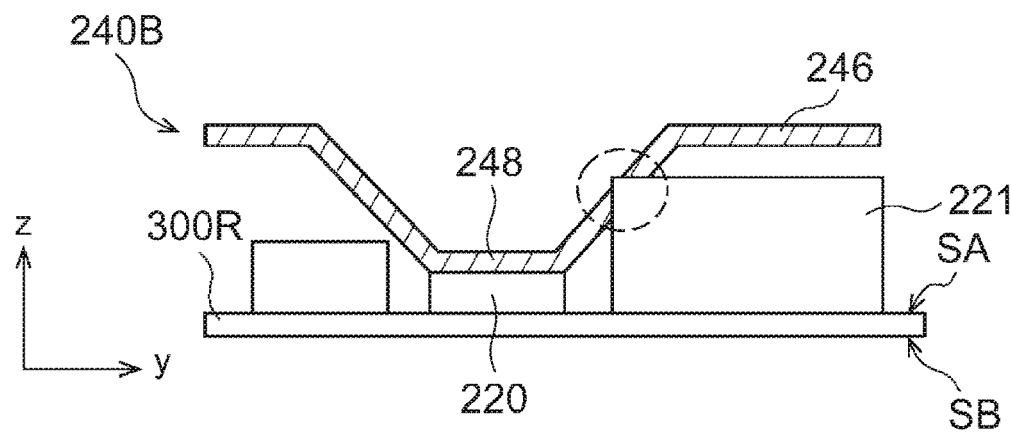

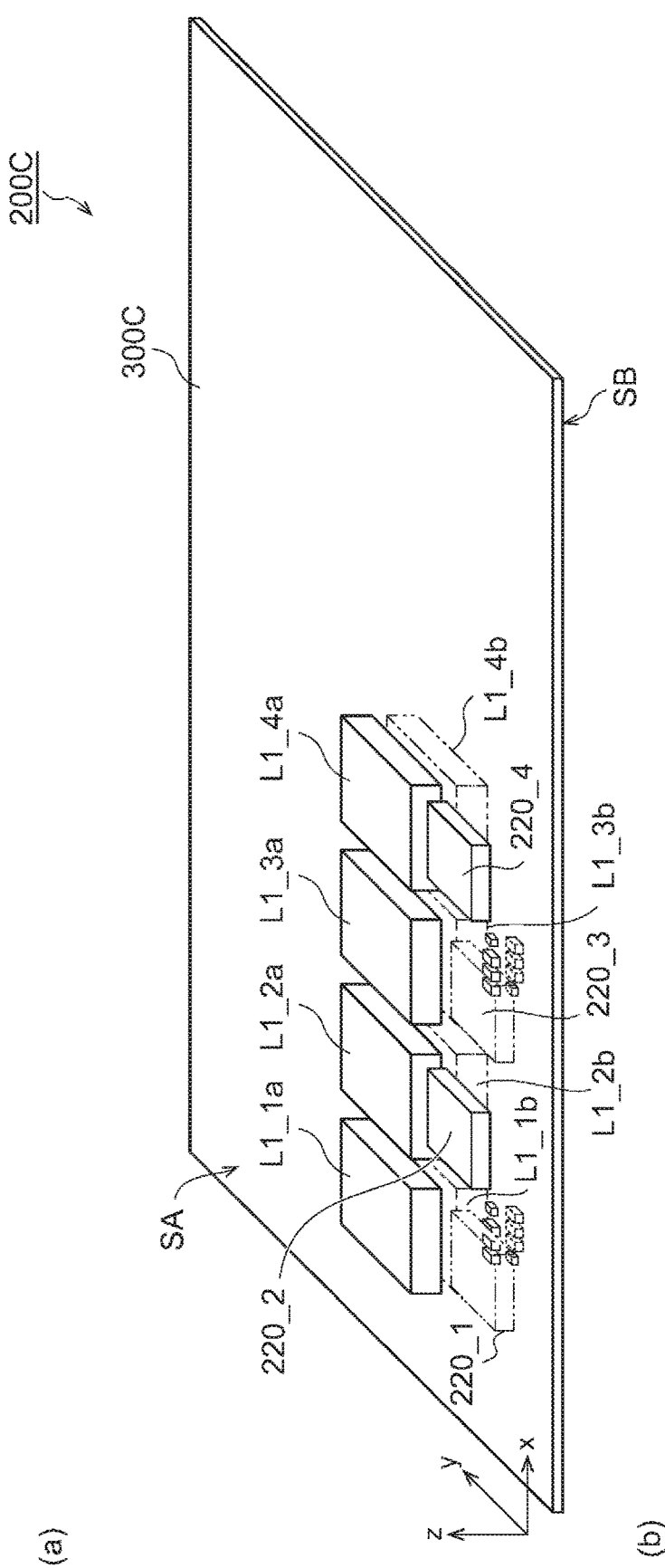

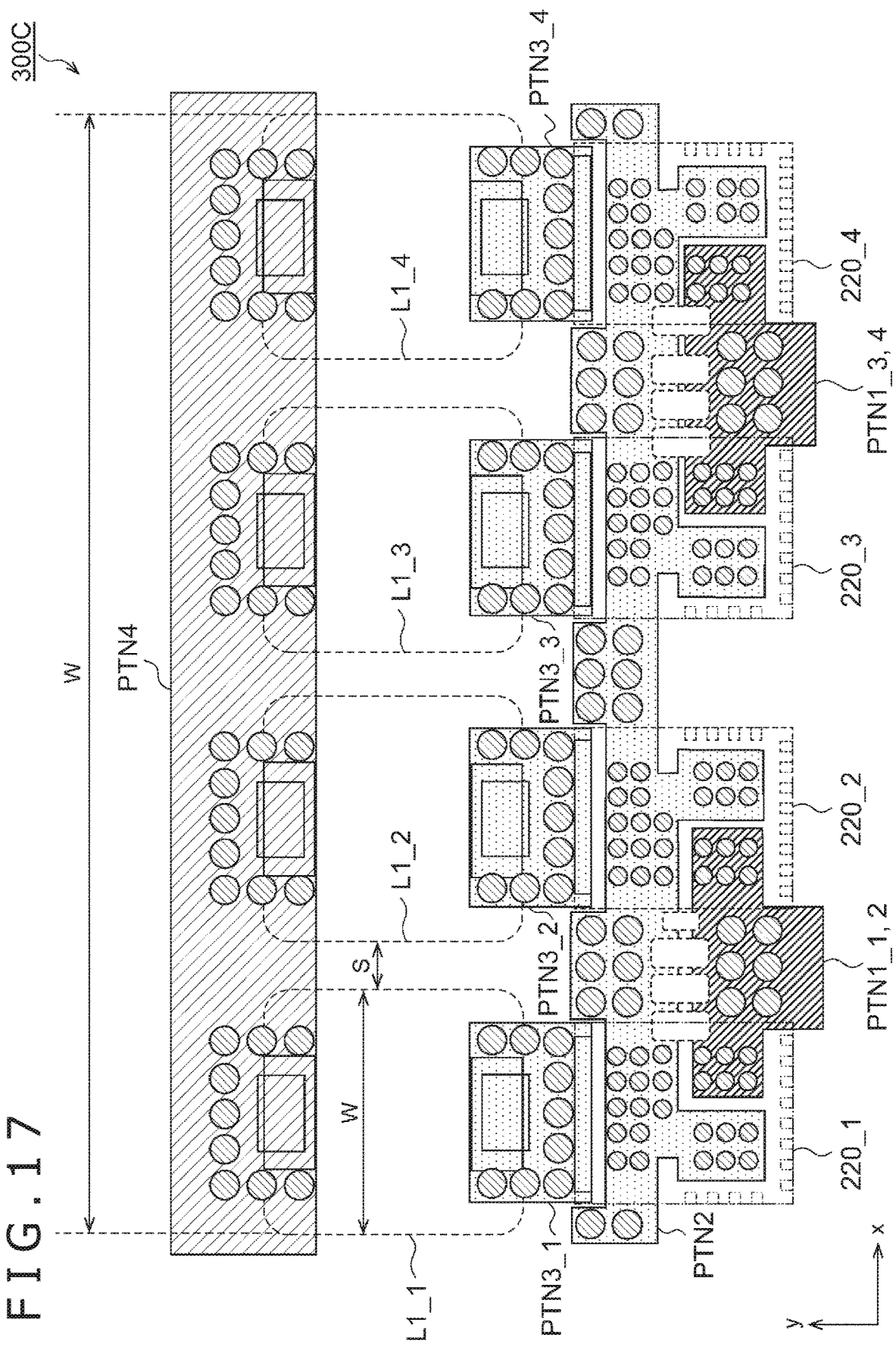

F I G. 1 8
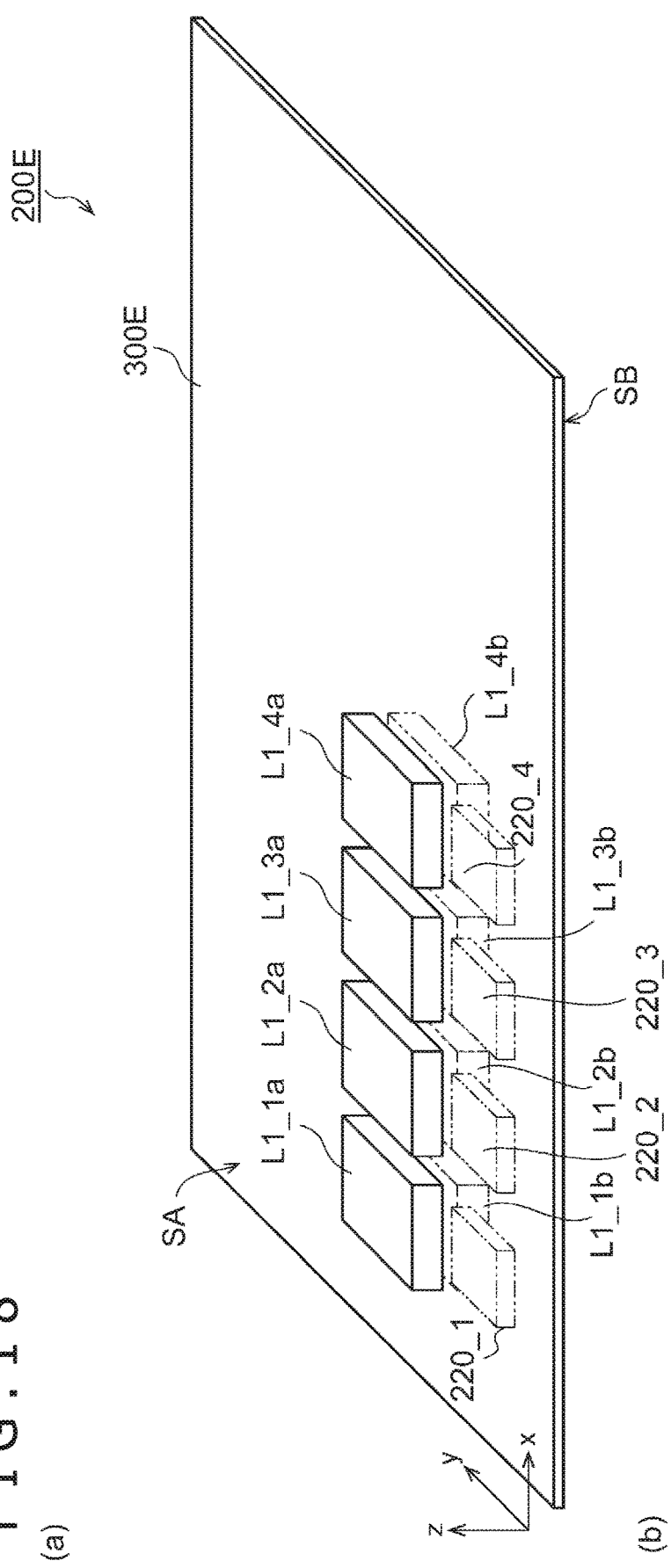

FIG.21
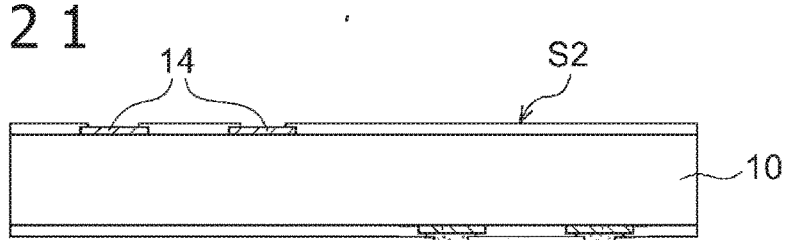
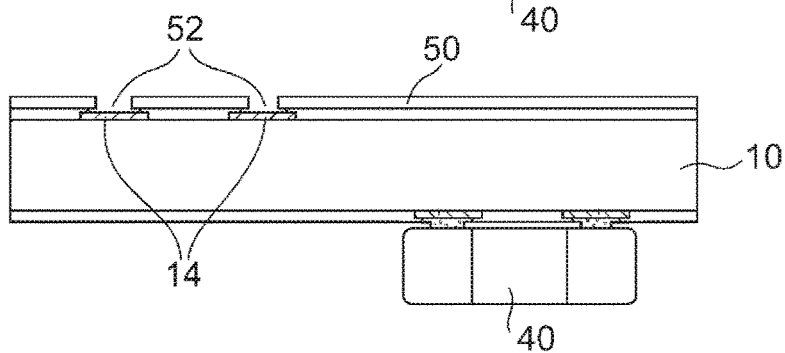
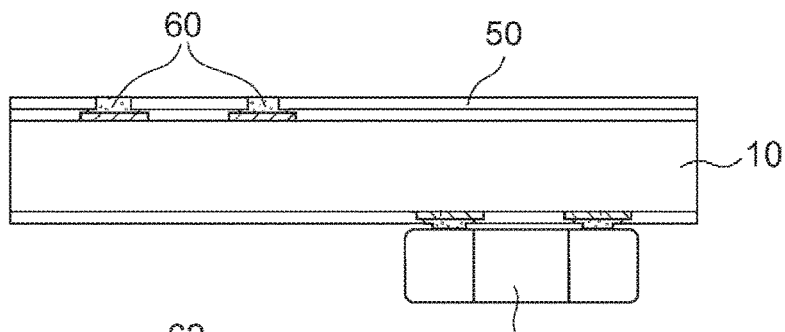
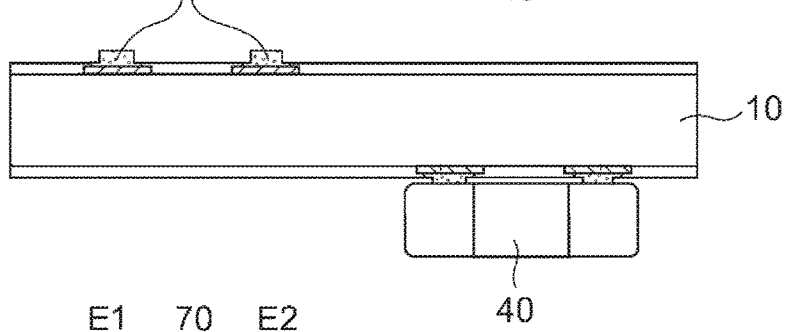
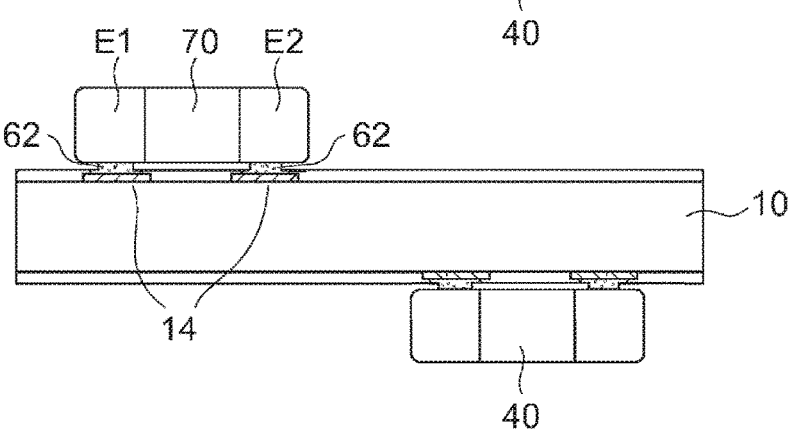

FIG. 22
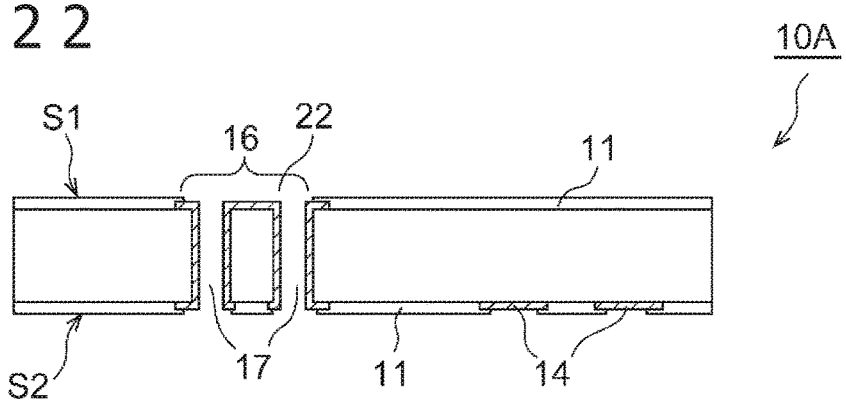
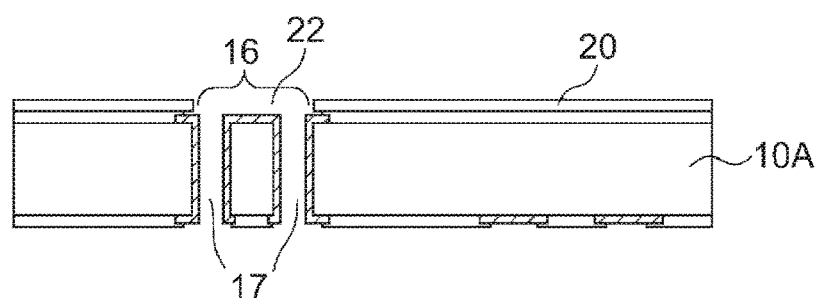
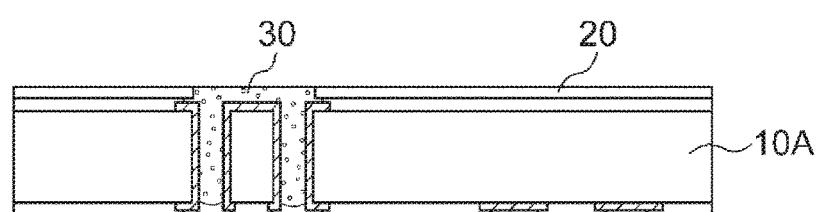
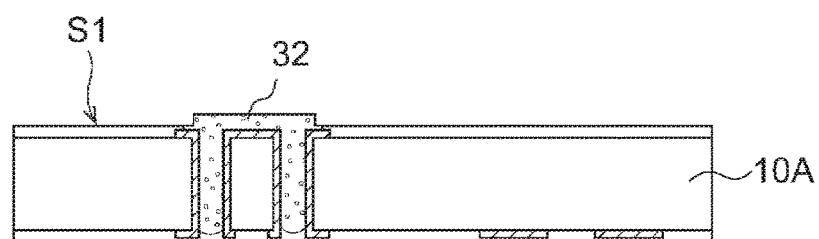
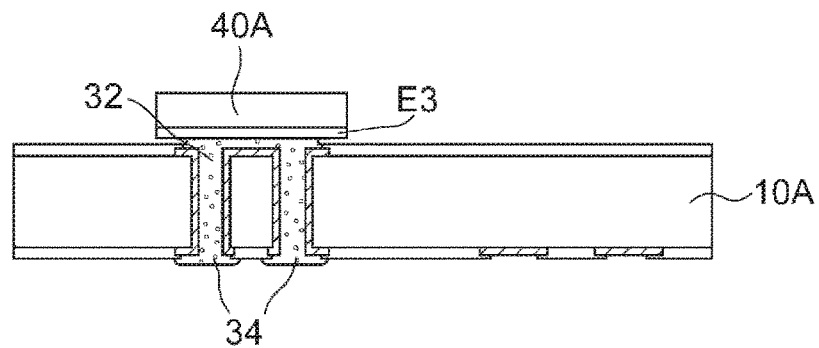

FIG.23
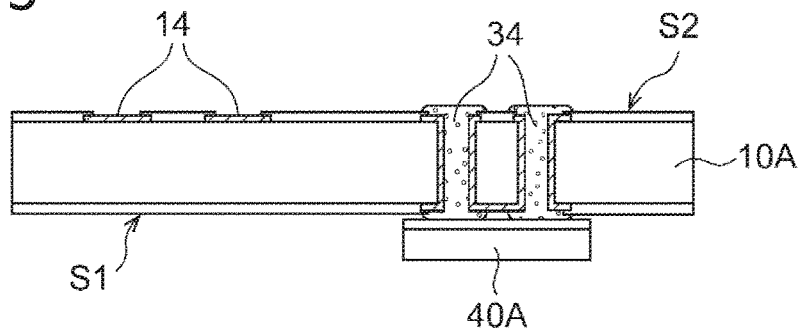
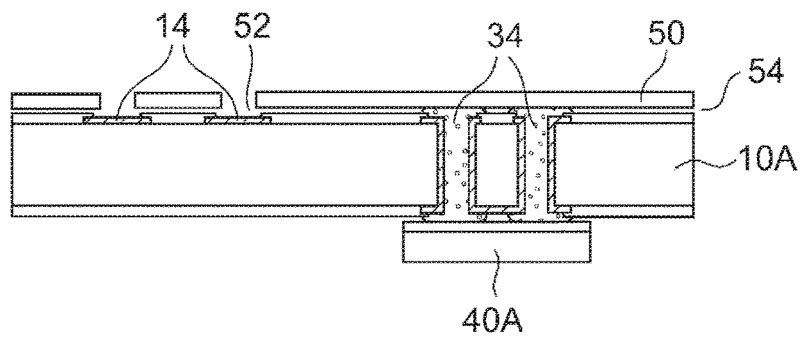
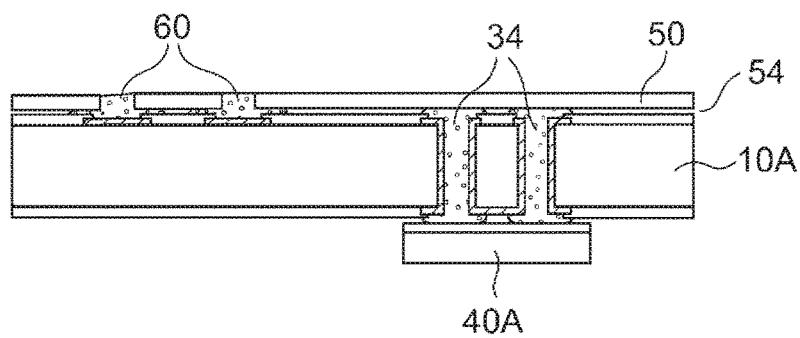
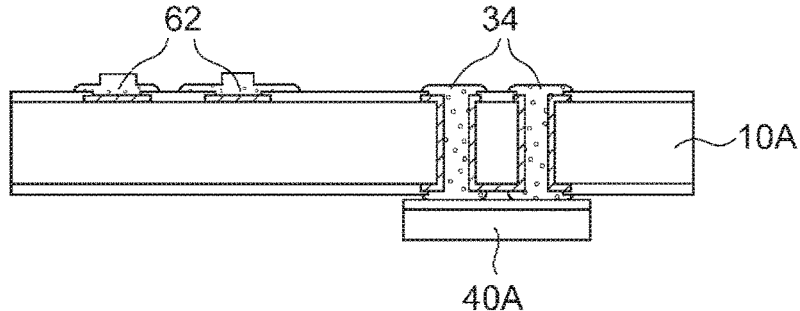
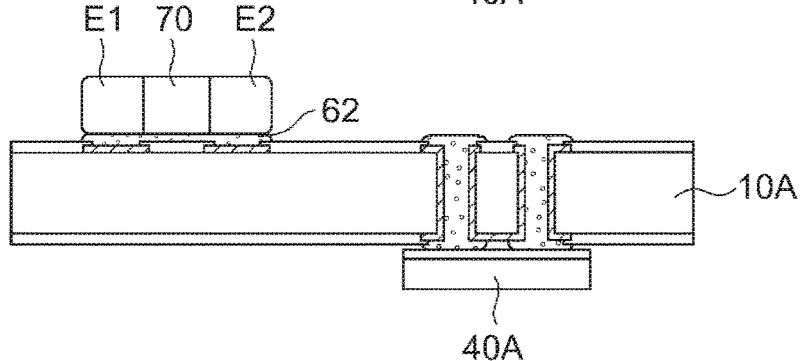

MULTI-PHASE STEP-DOWN DC/DC POWER SOURCE DEVICE

TECHNICAL FIELD

The present invention relates to a power source device.

BACKGROUND ART

In electronic equipment such as personal computers and game consoles, a DC (Direct Current)/DC converter (switching regulator) is used in order to step down a direct-current voltage which is supplied from a battery or an inverter, to an optimum voltage level for a load.

FIG. 1 is a circuit diagram illustrating a configuration example of a multi-phase step-down DC/DC converter. A DC/DC converter 200 has N phases (N≥2) and includes an input line 202, an output line 204, N inductors L1_1 to L1_N, an input capacitor Ci, an output capacitor Co, a controller 210, and N power modules 220_1 to 220_N.

The output line 204 is connected to the load (not depicted) whose power consumption (load current $I_{OUT}$) dynamically varies. The DC/DC converter 200 receives an input voltage $V_{IN}$ of the input line 202, generates an output voltage $V_{OUT}$ stabilized at a predetermined level, and supplies the generated output voltage $V_{OUT}$ to the load. The input line 202 is connected to the input capacitor Ci used to stabilize the input voltage $V_{IN}$. The output line 204 is connected to the output capacitor Co used to smooth the output voltage $V_{OUT}$.

The power modules 220 mainly have a VIN pin, a PGND pin, an SW pin, a VCC pin, an AGND pin, and a PWM pin. The power modules 220 include a high-side switch (switching transistor) M1, a low-side switch (synchronous rectifier transistor transistor) M2, a high-side driver 222, a low-side driver 224, and a logic circuit 226. The high-side switch M1 is disposed between the VIN pin and the SW pin. The low-side switch M2 is disposed between the SW pin and the PGND pin.

The controller 210 monitors a current or a load current $I_{OUT}$ flowing to each of the plurality of inductors L1_1 to L1_N and determines a drive phase number K. For example, in a case where N=4, four values, namely, 1, 2, 3, and 4 (or three values, namely, 1, 2, and 4) are selectable as the drive phase number K.

Further, the controller 210 receives a feedback signal $V_{FB}$ based on the output voltage $V_{OUT}$, generates a pulse signal $S_{PWM}$ whose duty ratio is adjusted such that the feedback signal $V_{FB}$ approaches a predetermined target voltage $V_{REF}$, and distributes the generated pulse signal $S_{PWM}$ to K power modules among the N power modules 220_1 to 220_N. Pulse signals $S_{PWM1}$ to $S_{PWMK}$ having a phase difference of 360/K degrees are distributed to the K power modules 220_1 to 220_K.

The DC/DC converter 200 is configured as described above. Next, operation of the DC/DC converter 200 is described below. The following description deals with a case where M=4 and where the drive phase number K may be 2, 3, or 4. FIGS. 2(a) to 2(c) are each a waveform diagram illustrating switching voltages Vsw1 to Vsw4 generated when K=2, 3, or 4.

SUMMARY

Technical Problems

Components of the DC/DC converter 200 are mounted on a printed circuit board. A conventional DC/DC converter 200 is configured such that the inductors L1_1 to L1_N and the power modules 220_1 to 220_N as main components are mounted on the same mounting surface. Here, the main components denote components that occupy a large area and allow a large current to flow.

In the case of a large-current application, the chip size of the inductors is enlarged, so that the size of the DC/DC converter is predominantly regulated by the size of the inductors.

The present invention has been made in view of the above problems. An exemplary object of an aspect of the present invention is to provide a power source device that is capable of reducing its occupied area.

Solution to Problems

An aspect of the present invention relates to a power source device. The power source device includes an input line, an output line, an output capacitor, N inductors, and N power modules. The input line receives a supply of a direct-current input voltage. The output line is connected to a load. The output capacitor is connected to the output line. The N inductors correspond to N phases and each have one end connected to the output line. The N power modules correspond to the N phases. The N power modules each have an input pin, a switching pin, and a ground pin. The input pin is connected to the input line. The switching pin is connected to another end of a corresponding inductor. The ground pin is grounded. The N inductors each include a plurality of inductor chips that are electrically connected in parallel to each other. The plurality of inductor chips are mounted separately on a main mounting surface and a sub-mounting surface of a printed circuit board. The sub-mounting surface is opposite to the main mounting surface.

It should be noted that any combination of the above-mentioned component elements and expressions of the present invention that are converted between, for example, methods, devices, and systems are also effective as the aspects of the present invention.

Advantageous Effects of Invention

The present invention makes it possible to reduce the area occupied by the power source device.

BRIEF DESCRIPTION OF DRAWINGS

FIGS. 2(a) to 2(c) are each a waveform diagram illustrating switching voltages Vsw1 to Vsw4 generated when K=2, 3, or 4.

FIG. 3(a) is a layout diagram illustrating a back-surface electrode of a power module, while FIG. 3(b) is a layout diagram illustrating back-surface electrodes of an inductor.

FIGS. 9(a) and 9(b) are cross-sectional views illustrating a heat sink according to a first configuration example.

FIGS. 10(a) and 10(b) are cross-sectional views illustrating a heat sink according to a second configuration example.

FIGS. 16(a) and 16(b) are layout diagrams illustrating the DC/DC converter according to an example 2-1.

FIG. 17 is a diagram illustrating a wiring pattern of the DC/DC converter according to the example 2-1.

FIGS. 18(a) and 18(b) are layout diagrams illustrating a DC/DC converter according to an example 2-2.

FIGS. 21(a) to 21(e) are cross-sectional views illustrating the electronic equipment assembly process.

FIGS. 22(a) to 22(e) are diagrams illustrating mounting of a component on a first surface S1, while FIGS. 23(a) to 23(e) are diagrams illustrating mounting of a component on a second surface S2.

FIGS. 23(a) to 23(e) are diagrams illustrating mounting of a component on the second surface S2.

DESCRIPTION OF EMBODIMENTS

Overview of Embodiments

Figure 1:
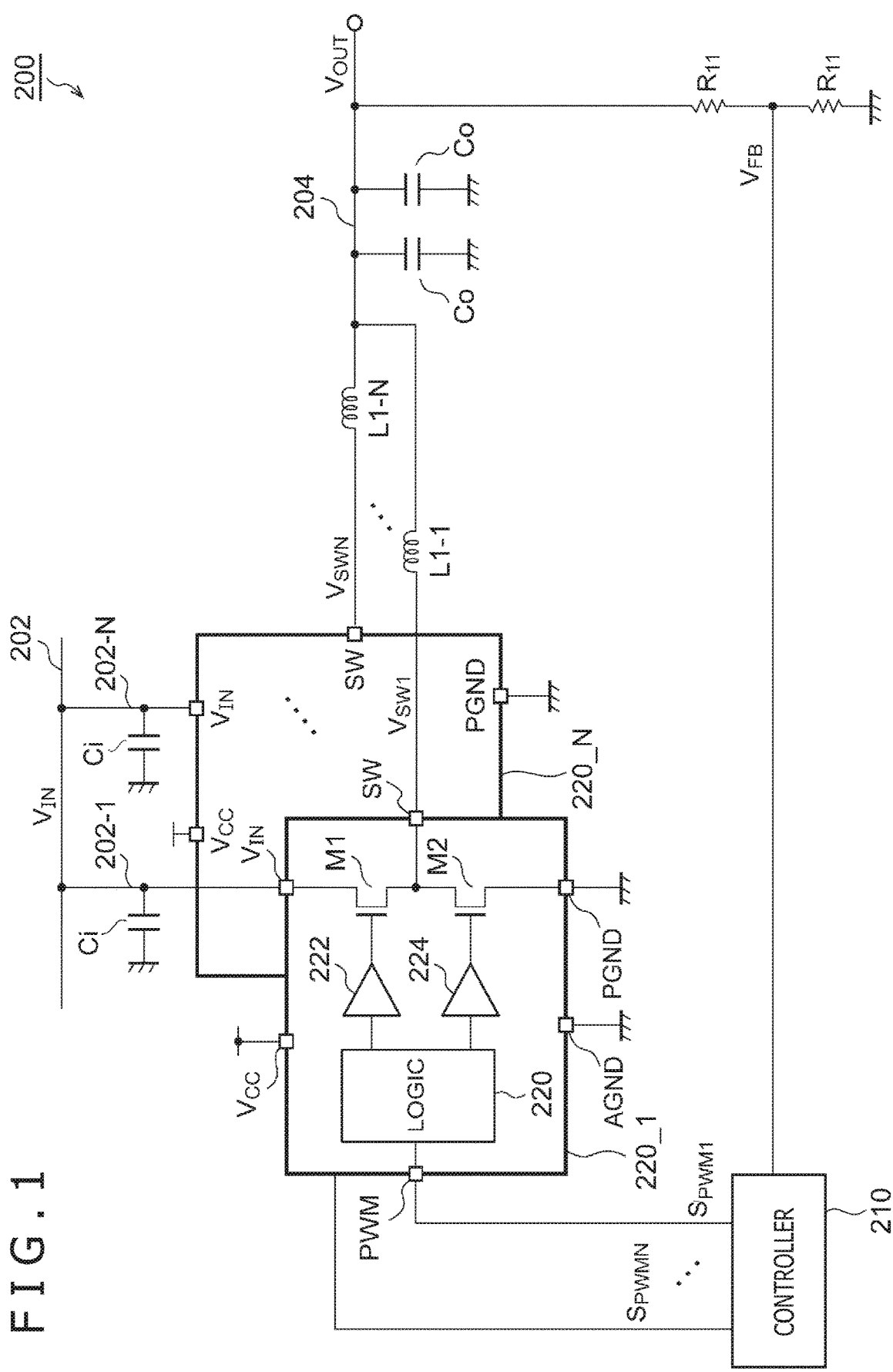
FIG. 1 is a circuit diagram illustrating a configuration example of a multi-phase step-down DC/DC converter.

A multi-phase power source device is disclosed in an embodiment described in the present specification. The power source device includes an input line, an output line, an output capacitor, N inductors, and N power modules. The input line receives the supply of a direct-current input voltage. The output line is connected to a load. The output capacitor is connected to the output line. The N inductors correspond to N phases.

The N inductors are each connected at one end thereof to the output line. The N power modules correspond to the N inductors and each have an input pin, a switching pin, and a ground pin. The input pin is connected to the input line. The switching pin is connected to the other end of the corresponding inductor. The ground pin is grounded. The N inductors each include a plurality of inductor chips that are electrically connected in parallel to each other. The plurality of inductor chips are mounted separately on a main mounting surface and a sub-mounting surface of a printed circuit board. The sub-mounting surface is opposite to the main mounting surface.

When the inductors include the plurality of parallel inductor chips, the amount of current flowing to each inductor chip is decreased. This makes it possible to reduce the size of the inductor chips. The area occupied by the power source device can be reduced by mounting the small-sized inductor chips in a distributed manner on both surfaces of the printed circuit board.

Two inductor chips may be used as the plurality of inductor chips. The two inductor chips may be mounted in an overlap manner on the main mounting surface and the sub-mounting surface. The distances between the power modules and the two inductor chips connected to the power modules can then be equalized in each phase. This makes it possible to equalize the impedances of a plurality of current paths.

At least one of the N power modules may be mounted on the sub-mounting surface. Using the sub-mounting surface for mounting a power module provides extra space. The extra space can be used to further reduce the area occupied by the power source device and to provide improved cooling performance.

The N inductors may be linearly arranged in a first direction. The i-th (i=1 to N) power module may be disposed adjacently in a second direction to the corresponding i-th inductor. The second direction is perpendicular to the first direction.

The N power modules may be mounted alternately on the main mounting surface and the sub-mounting surface. In such an alternative configuration, heat generated by the plurality of power modules can be dissipated toward both surfaces of the printed circuit board. Further, thermal concentration can be alleviated because the intervals between the adjacent power modules on the same mounting surface are enlarged twofold.

The N power modules may make pairs. More specifically, the first and second power modules of the N power modules may make a pair, the third and fourth power modules may make a pair, and so on. Further, two power modules as a pair may be connected to a common input line. In such an alternative configuration, capacitors connected to the input line can be shared by two phases. This makes it possible to decrease the number of components, or double the effect of capacitors by using the same number of capacitors.

The present invention will now be described in terms of preferred embodiments with reference to the accompanying drawings. Identical or equivalent component elements, members, and processes depicted in the accompanying drawings are denoted by the same reference signs and will not be redundantly described as appropriate. Further, the embodiments are illustrative and not restrictive. All features described in conjunction with the embodiments and combinations thereof are not necessarily essential to the present invention.

In the present specification, "a state where a member A is connected to a member B" includes not only a state where the member A is physically and directly connected to the member B, but also a state where the members A and B are indirectly connected to each other through other members that do not substantially affect the electrical connection between the members A and B or that do not weaken the functions and effects provided by the connection of the members A and B.

Similarly, "a state where a member C is disposed between the members A and B" includes not only a state where the members A and C or the members B and C are directly connected to each other, but also a state where the members A and C or the members B and C are indirectly connected to each other through other members that do not substantially affect the electrical connection between the members A and C or between the members B and C or that do not weaken the functions and effects provided by the connection of the members A and C or of the members B and C.

First Embodiment

One aspect of the present invention is comprehended as a DC/DC converter layout or a mounting technology. In a first embodiment, the function or equivalent circuit of the DC/DC converter is similar to the one depicted in FIG. 1.

The power modules 220 common to some examples will now be described. The power modules 220 themselves are publicly known and are manufactured and sold by various IC makers.

The circuit configuration of the power modules 220 is similar to the one depicted in FIG. 1. More specifically, the power modules 220 include the high-side transistor M1, the low-side transistor M2, the high-side driver 222, the low-side driver 224, and the logic circuit 226. Further, the power modules 220 have, for example, an input (VIN) pin, a switching pin (SW), ground pins (PGND, AGND), a power supply (VCC) pin, and a control (PWM) pin. It should be noted that the power modules 220 additionally include, for example, a bootstrap circuit and various protection circuits as well as a plurality of pins related to such circuits. However, they are neither depicted in the drawings nor described below because they are irrelevant to the present invention.

A power supply voltage $V_{CC}$ is supplied through the VCC pin to the logic circuit 226 and various other circuit blocks. The AGND pin is a ground, for example, for the high-side driver 222, the low-side driver 224, and the logic circuit 226. A direct-current input voltage $V_{IN}$ is supplied to the VIN pin. The PGND pin is a ground for an output stage.

The logic circuit 226 generates a high-side pulse and a low-side pulse according to a PWM signal $S_{PWM}$ inputted to the PWM pin. The high-side driver 222 drives the high-side transistor M1 on the basis of the high-side pulse. The low-side driver 224 drives the low-side transistor M2 on the basis of the low-side pulse.

A pin arrangement of each of major circuit component packages will now be described. FIG. 3(a) is a layout diagram illustrating a back-surface electrode of the power modules 220. As described earlier, the power modules 220 have the VIN pin, the PGND pin, the SW pin, the VCC pin, and the AGND pin. Among these pins, the VIN pin and the GND pins are relatively larger in area than the other pads. Particularly, the PGND pin and the AGND pin are large in area because they also function as a thermal pad. The PWM pin and other control pins are assigned to the remaining pins. It should be noted that the layouts of the back-surface electrodes depicted in FIGS. 3(a) and 3(b) are merely illustrative and obviously different from one chip vendor to another and from one product to another.

FIG. 3(b) is a layout diagram illustrating a back-surface electrode of the inductors L1. The inductors L1 include a first electrode E1 and a second electrode E2. The first electrode E1 and the second electrode E2 are disposed at the center of two opposite sides.

One of tasks of the present embodiment is to provide an improved layout. Therefore, first of all, a layout serving as the basis of comparison (hereinafter referred to as a comparative technology) will be described.

In recent years, electronic circuits are mounted by using a surface-mount technology (SDT (surface Mount Technology)). Surface mounting is achieved by applying solder cream to pads (lands) formed on a printed circuit board, mounting components by using a mounter, and then performing a reflow process.

In a case where the components are to be surface-mounted on both surfaces of the printed circuit board, some components are first mounted on one surface (preceding mounting surface). Then, with the printed circuit board inverted, the other components are mounted on the other surface (succeeding mounting surface). When the reflow process is performed on the succeeding mounting surface, solder on the preceding mounting surface is reheated. If the components mounted on the preceding mounting surface are heavy or large-sized, the mounted components may possibly become displaced or fall down. For this reason, components that are mountable on the preceding mounting surface are limited in size and weight. Therefore, the preceding mounting surface is generally used as a sub-mounting surface. That is, components relatively small in number, light, or small-sized are mounted on the sub-mounting surface, and components relatively large in number, heavy, or large-sized are mounted on a main mounting surface. DC/DC converters are no exception either, so that all components are basically mounted on the main mounting surface even when the comparative technology is used.

Figure 4:
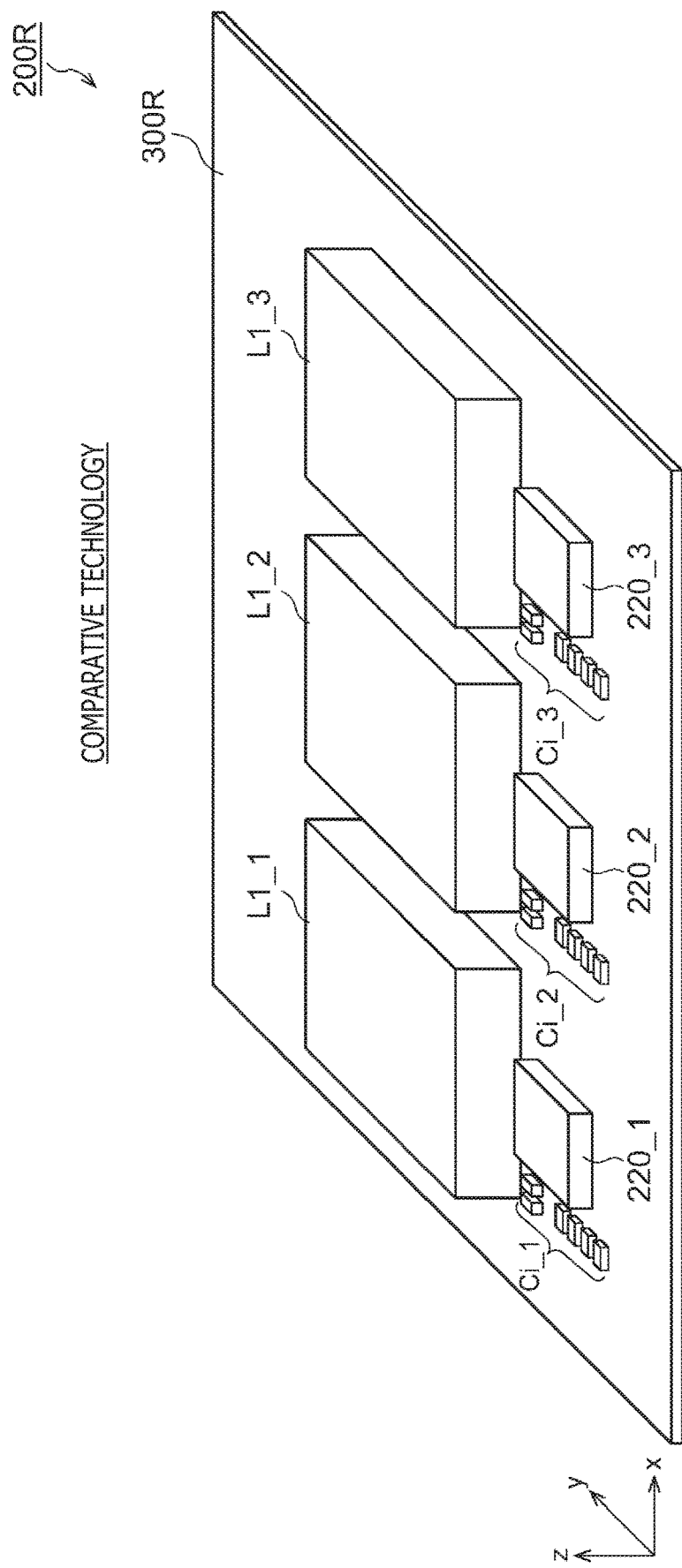
FIG. 4 is a layout diagram illustrating a DC/DC converter according to a comparative technology.

FIG. 4 is a layout diagram illustrating a DC/DC converter according to the comparative technology. In the example depicted in FIG. 4, it is assumed that N=3. The controller 210, the power modules 220_1 to 220_N, the input capacitor Ci, and the output capacitor Co (these are referred to as the main components) are all laid out on a main mounting surface SA of a printed circuit board 300R.

The plurality of inductors L1_1 to L1_N are linearly arranged in a first direction (x direction) of the printed circuit board. The power modules 220_# (#=1, 2, . . . , N) are disposed adjacently in a second direction (y direction) to the corresponding inductors L1_#. This can reduce the parasitic resistance between the power modules 220_# and the inductors L1_#.

Figure 5:
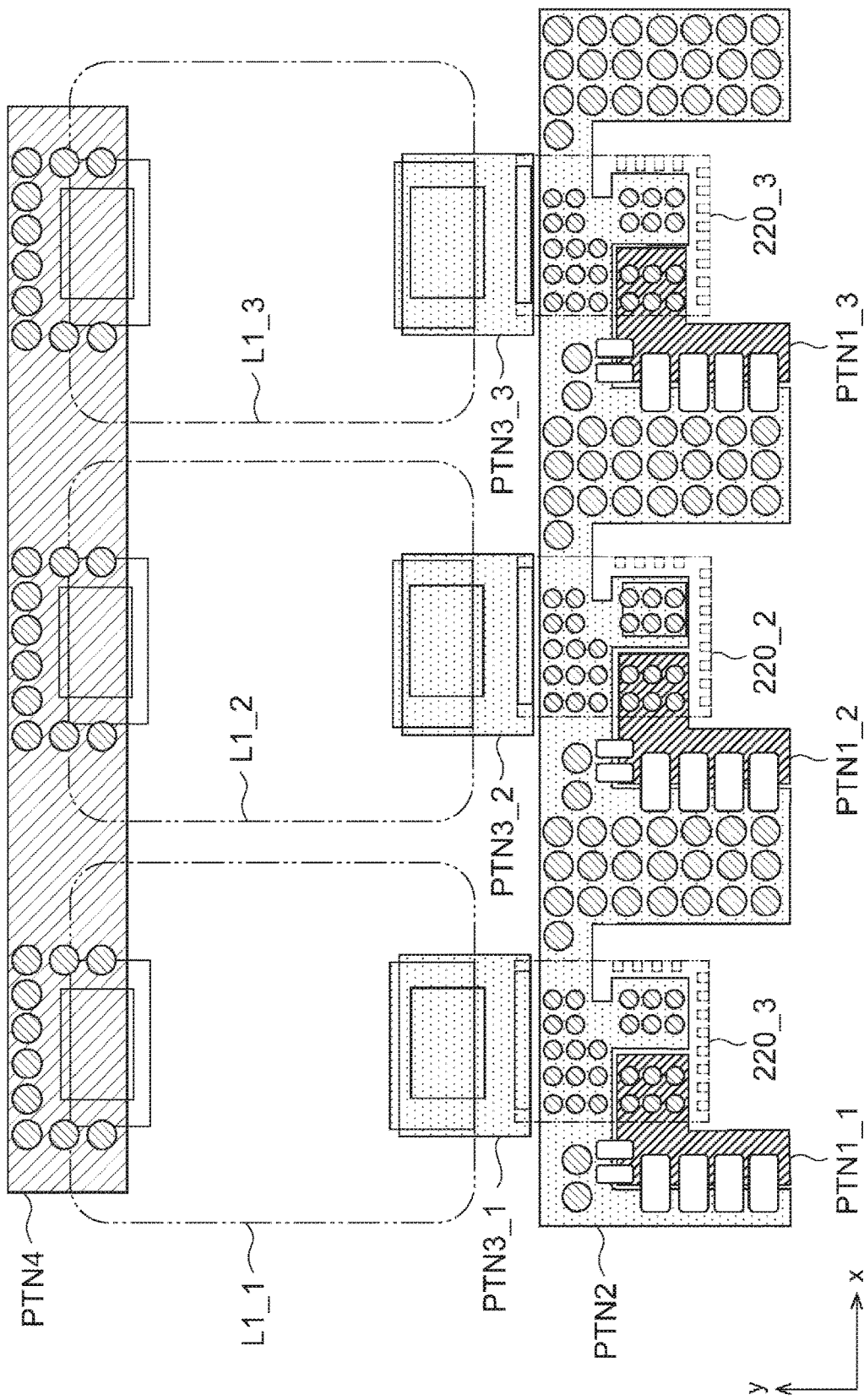
FIG. 5 is a diagram illustrating a wiring pattern of a printed circuit board according to the comparative technology.

FIG. 5 is a diagram illustrating a wiring pattern of the printed circuit board 300R according to the comparative technology. In FIG. 5, via holes are marked by circles. A plurality of pattern wirings (printed wirings) PTN1_1 to PTN1_3, PTN_2, PTN3_1 to PTN3_3, PTN4 are formed on the printed circuit board 300. The first pattern wirings PTN1_1 to PTN1_3 correspond to input lines 202_1 to 202_3 depicted in FIG. 1. The input pins VIN of the power modules 220_# (#=1, 2, . . . , N) are connected to the corresponding pads of the first pattern wirings PTN1_#.

The second pattern wiring PTN2 is a ground plane and is formed to be shared by all phases in order to keep the impedance as low as possible. The ground pins PGND of the power modules 220_# (#=1, 2, . . . , N) are connected to the corresponding pads of the second pattern wiring PTN2.

Input capacitors Ci_# are disposed between the first pattern wirings PTN1_# and the second pattern wiring PTN2. The input capacitors Ci_# may be MLCCs (Multilayer Ceramic Capacitors) or electrolytic capacitors or may be a combination of such capacitors.

The third pattern wirings PTN3_1 to PTN3_3 are wirings depicted in FIG. 1 for connecting the SW pins of the power modules 220 to one end of the inductors L1. The SW pins SW of the power modules 220_# (#=1, 2, . . . , N) are connected to the corresponding pads of the third pattern wirings PTN3_#. Further, the electrodes E1 of the inductors L1_# (#=1, 2, . . . , N) are connected to the corresponding pads of the third pattern wirings PTN3_#.

The fourth pattern wiring PTN4 corresponds to the output line 204 depicted in FIG. 1. The electrodes E2 of the inductors L1_# (#=1, 2, . . . , N) are connected to the corresponding pads of the fourth pattern wiring PTN4. The output capacitor Co depicted in FIG. 1 (not depicted in FIG. 5) is connected between the fourth pattern wiring PTN4 and a ground plane The impedances of the first to fourth pattern wirings PTN1 to PTN4 need to be as low as possible because a large current flows in the first to fourth pattern wirings PTN1 to PTN4. Therefore, these pattern wirings PTN1 to PTN4 each form a multilayer wiring and are connected through via holes to wirings in a different wiring layer not depicted in FIG. 5.

Component layout according to the comparative technology is as described above. Component layout according to the embodiment will now be described. In the present embodiment, it is assumed that at least one of the N power modules 220 is mounted on a sub-mounting surface SB of the printed circuit board 300. The sub-mounting surface SB is opposite to the main mounting surface SA of the printed circuit board 300. Some examples of the present embodiment are described below.

Example 1-1

Figure 6:
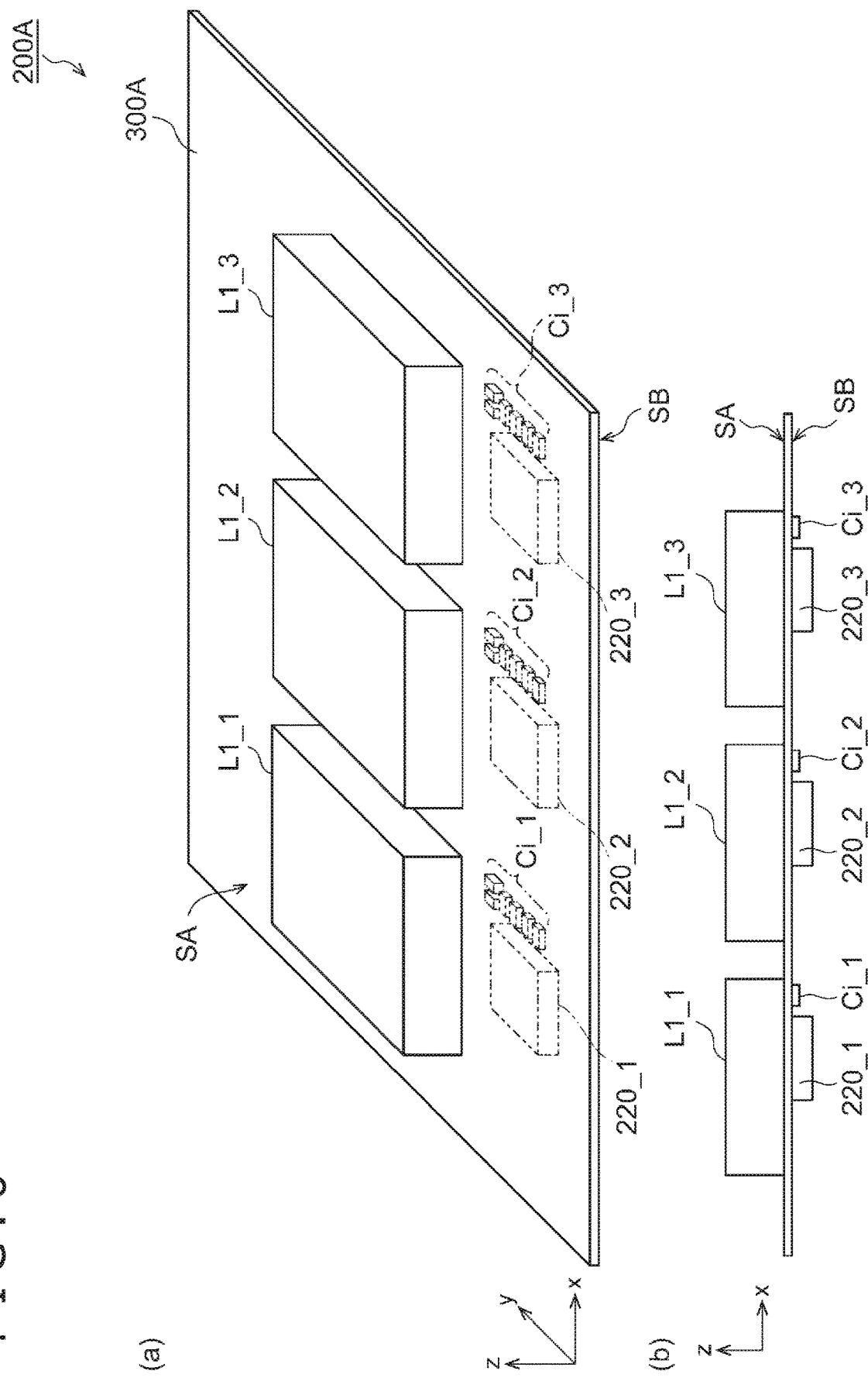
FIGS. 6(a) and 6(b) are layout diagrams illustrating a DC/DC converter according to an example 1-1.

FIGS. 6(a) and 6(b) are layout diagrams illustrating a DC/DC converter 200A according to an example 1-1. FIG. 6(a) presents a perspective view, and FIG. 6(b) presents a cross-sectional view. In the example 1-1, all the power modules 220_1 to 220_3 are mounted on the sub-mounting surface SB. It is preferable to connect the input capacitors Ci_# in close proximity to the VIN pins of the power modules 220_#. Accordingly, in the example 1-1, the input capacitors Ci_# are also mounted on the sub-mounting surface SB.

Figure 7:
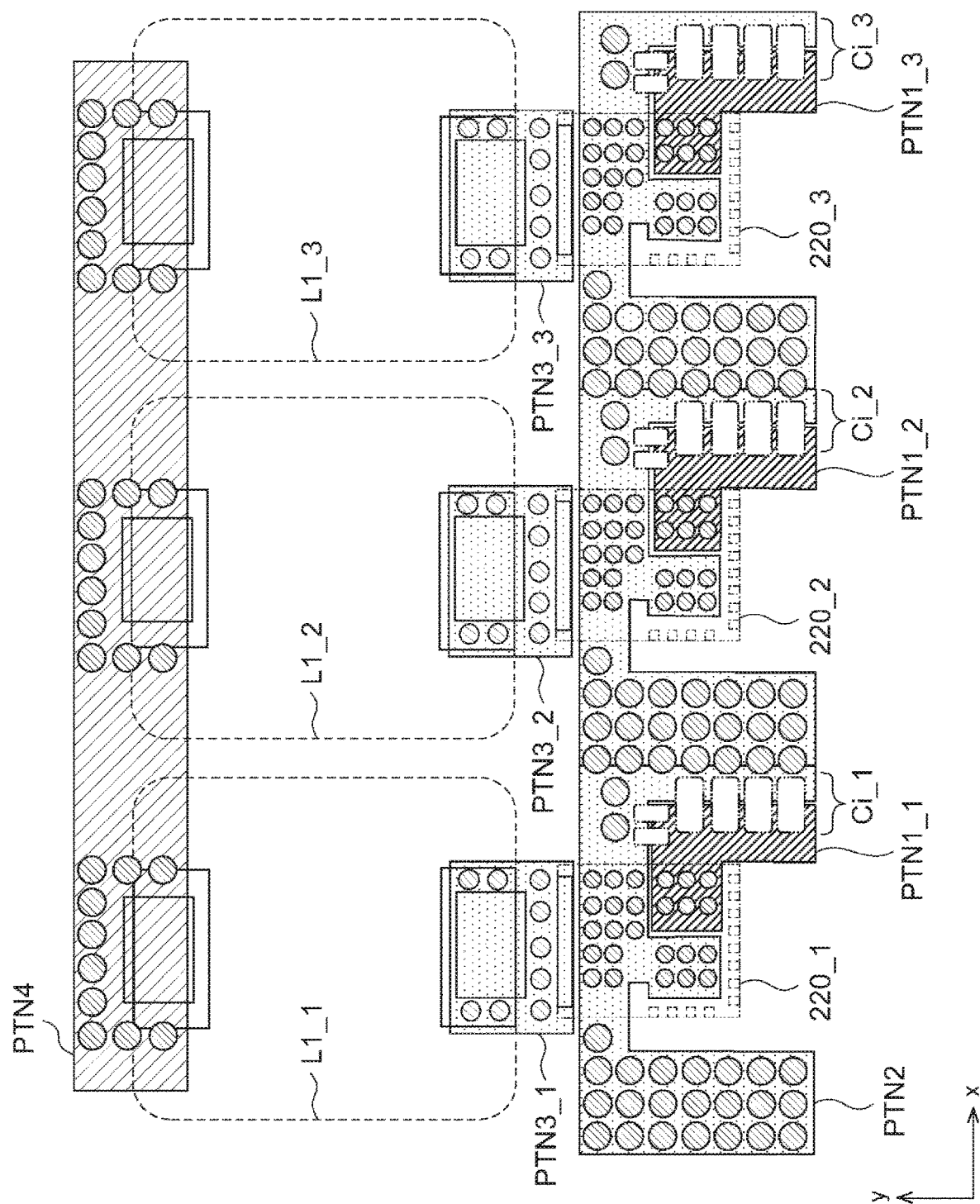
FIG. 7 is a diagram illustrating a wiring pattern of the DC/DC converter according to the example 1-1.

FIG. 7 is a diagram illustrating a wiring pattern of the DC/DC converter 200A according to the example 1-1. In FIG. 7, components to be mounted on the main mounting surface SA are indicated by broken lines, and components to be mounted on the sub-mounting surface SB are indicated by two-dot chain lines. The functions of the pattern wirings PTN1 to PTN4 are similar to those depicted in FIG. 5. Further, the pattern wirings PTN1 to PTN4 are multilayer wirings, are formed on both the main mounting surface SA and the sub-mounting surface SB (and in an intermediate wiring layer) to overlap with each other, and are electrically connected to each other through via holes.

The DC/DC converter 200A according to the example 1-1 is configured as described above. Using the sub-mounting surface SB for mounting the power modules 220 provides extra space on the main mounting surface SA or the sub-mounting surface SB. This produces advantages described below.

Figure 8:
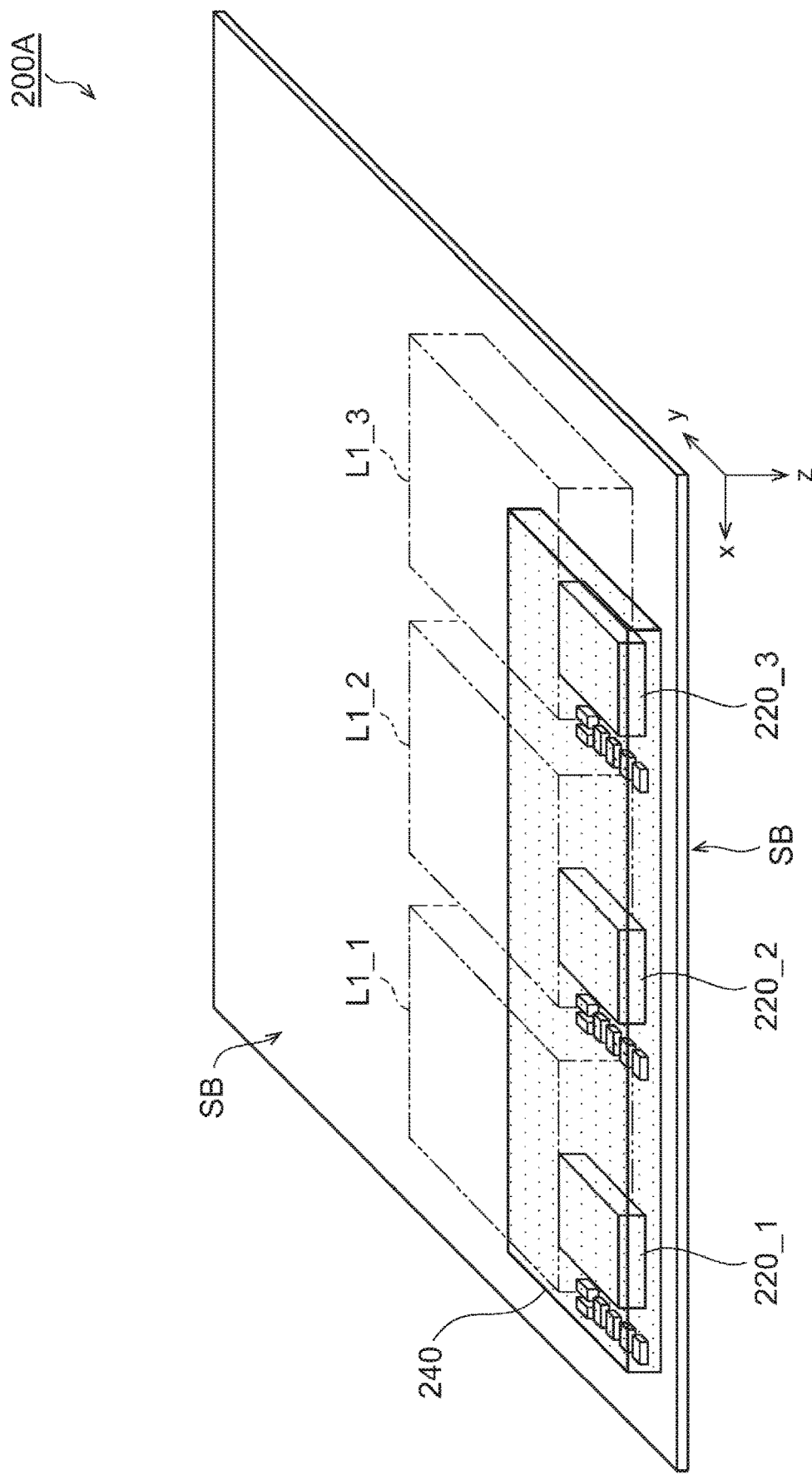
FIG. 8 is a perspective view illustrating the DC/DC converter as viewed from the sub-mounting surface SB side.

FIG. 8 is a perspective view illustrating the DC/DC converter 200A as viewed from the sub-mounting surface SB side. The DC/DC converter 200A includes a heat sink 240. The heat sink 240 is in contact with each of the upper surfaces of the plurality of power modules 220_1 to 220_3. No components taller than the power module 220 exist in the vicinity of the power modules 220_1 to 220_N on the sub-mounting surface SB side. Therefore, the large-size heat sink 240 can be included in the DC/DC converter 200A to provide increased cooling efficiency.

A configuration example of the heat sink will now be described in detail. FIGS. 9(a) and 9(b) are cross-sectional views illustrating a heat sink 240A according to a first configuration example. FIG. 9(a) depicts a state where the heat sink 240A is applied to the example 1-1. FIG. 9(b) depicts a state where the same heat sink 240A is applied to the comparative technology depicted in FIG. 4.

The heat sink 240A includes a heat dissipation portion 242 and a contact portion 244. The heat dissipation portion 242 has an opening into which the contact portion 244 is fit. The contact portion 244 is brought into contact with the power module 220 to be cooled.

The example 1-1 will now be compared with the comparative technology. As depicted in FIG. 9(b), the comparative technology for mounting the power module 220 on the main mounting surface SA is configured such that a tall component 221 (e.g., an inductor) exists in the vicinity of the power module 220. Therefore, it is difficult to position the heat dissipation portion 242 near the surface of the printed circuit board. This increases a height of the contact portion 244 in a Z direction. This results in increased thermal resistance and thus leads to degraded cooling performance.

On the other hand, in the example 1-1 where the power module 220 is mounted on the sub-mounting surface SB, no tall components exist in the vicinity of the power module 220 as depicted in FIG. 9(a). Therefore, the heat dissipation portion 242 can be positioned near the surface of the printed circuit board. This makes it possible to reduce the height of the contact portion 244 in the Z direction. As a result, the thermal resistance can be reduced to provide improved cooling performance.

FIGS. 10(a) and 10(b) are cross-sectional views illustrating a heat sink 240B according to a second configuration example. The heat sink 240B includes one heat dissipation plate 246 and has a bulge 248 subjected to a drawing process. At the bulge 248, the heat dissipation plate 246 is brought into contact with the surface of the power module 220.

The example 1-1 will be compared with the comparative technology. As depicted in FIG. 10(b), the comparative technology is configured such that the tall component 221 (e.g., an inductor) exists in the vicinity of the power module 220. As the bulge 248 interferes with the component 221, it is difficult for the comparative technology to adopt the second configuration example.

On the other hand, in the example 1-1 where the power module 220 is mounted on the sub-mounting surface SB, no components interfering with the bulge 248 of the heat sink 240B exist in the vicinity of the power module 220. This increases the freedom of design of the heat sink 240B and makes it possible to adopt the heat sink 240B according to the second configuration example.

The cost of the heat sink 240B in FIGS. 10(a) and 10(b) can be reduced because it is simpler in structure than the heat sink 240A in FIGS. 9(a) and 9(b). Further, the heat sink 240B in FIGS. 10(a) and 10(b) does not require any opening. Therefore, the heat sink 240B in FIGS. 10(a) and 10(b) is excellent in electromagnetic noise shielding performance and able to improve EMC (Electro Magnetic Compatibility).

Example 1-2

Figure 11:
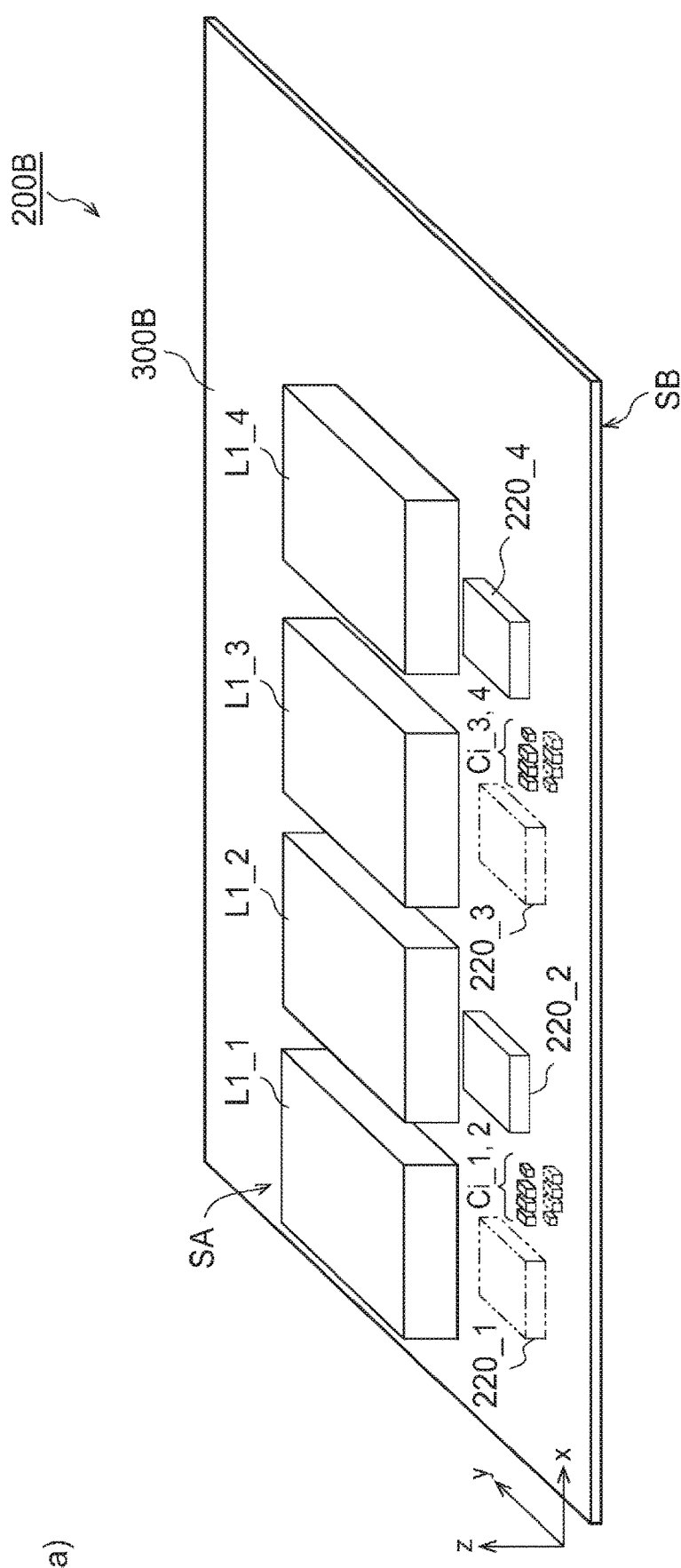
FIGS. 11(a) and 11(b) are layout diagrams illustrating a DC/DC converter according to an example 1-2.

A DC/DC converter 200B according to an example 1-2 will now be described with reference to a case where N=4. FIGS. 11(a) and 11(b) are layout diagrams illustrating the DC/DC converter 200B according to the example 1-2. FIG. 11(a) presents a perspective view, and FIG. 11(b) presents a cross-sectional view. In the example 1-2, the N power modules 220_1 to 220_N are mounted alternately on the main mounting surface SA and the sub-mounting surface SB. More specifically, odd-numbered power modules 220_# (#=1, 3, . . . ) are mounted on the sub-mounting surface SB, and even-numbered power modules 220_* (*=2, 4, . . . ) are mounted on the main mounting surface SA. The reverse is certainly possible as well.

Figure 12:
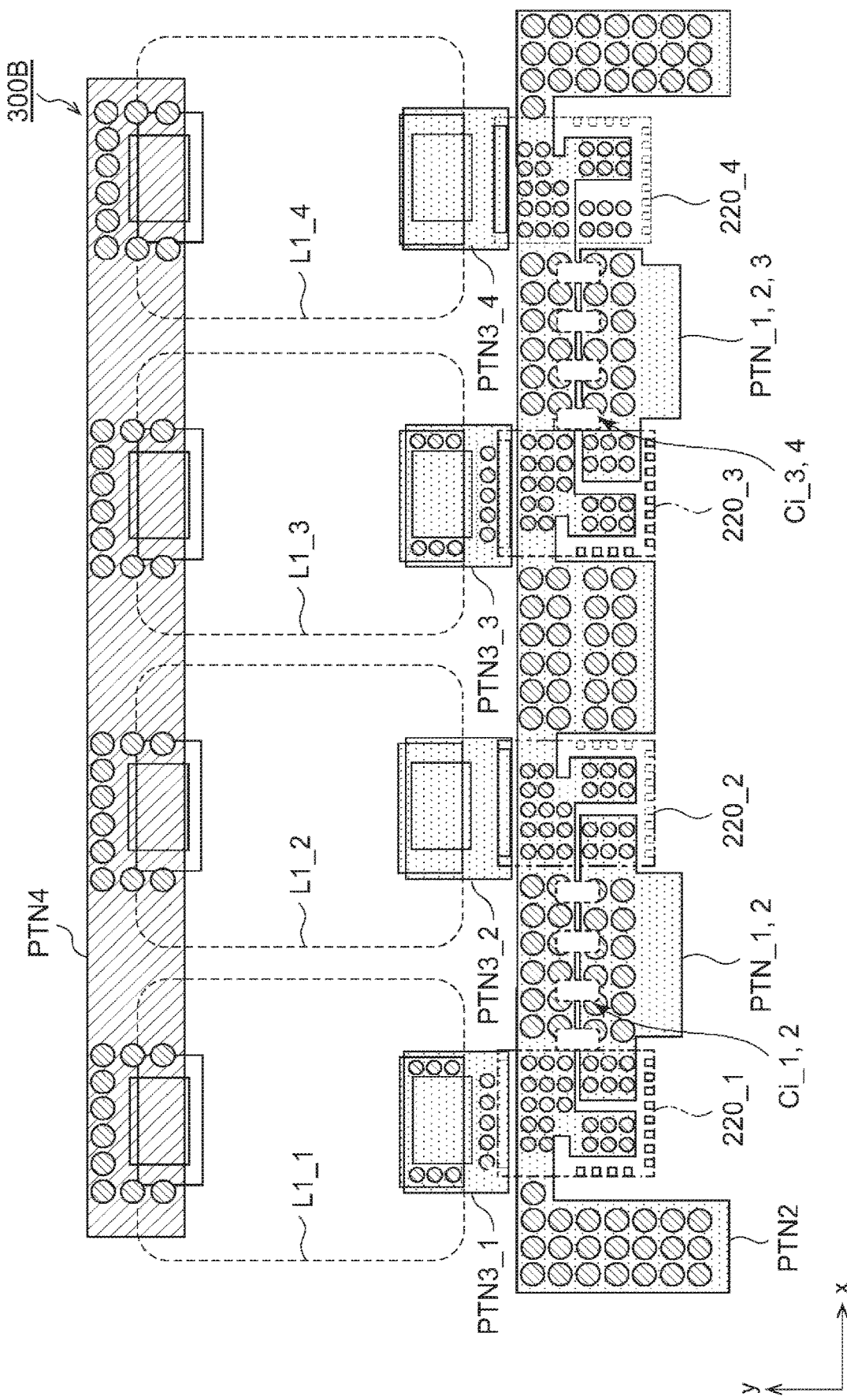
FIG. 12 is a diagram illustrating a wiring pattern of the DC/DC converter according to the example 1-2.

FIG. 12 is a diagram illustrating a wiring pattern of the DC/DC converter 200B according to the example 1-2. In FIG. 12, components to be mounted on the main mounting surface SA are indicated by broken lines, and components to be mounted on the sub-mounting surface SB are indicated by two-dot chain lines. The functions of the pattern wirings PTN1 to PTN4 are as described earlier. Further, the pattern wirings PTN1 to PTN4 are multilayer wirings, are formed on both the main mounting surface SA and the sub-mounting surface SB (and in the intermediate wiring layer) to overlap with each other, and are electrically connected to each other through via holes.

In the example 1-2, the N power modules are configured such that the first and second modules make a pair, the third and fourth modules make a pair, and so on. Further, two power modules 220_i and 220_j as a pair are connected to a common input line (i.e., a common first pattern wiring PTN1_i, j).

When all the power modules 220 are mounted on the same mounting surface as is the case with the example 1-1 or the comparative technology, it is necessary to form the first pattern wiring PTN1 for each power module 220. On the other hand, when the power modules 220 are mounted alternately on the main mounting surface SA and the sub-mounting surface SB as described in the example 1-2, VIN terminals are positioned adjacently to each other. This is advantageous in that a common input line can be used.

Further, using the common input line (first pattern wiring PTN1_i, j) provides such an advantage that a common input capacitor Ci_i, j can also be used. More specifically, the input capacitor Ci_i, j on the main mounting surface SA functions simultaneously as an input capacitor for the power modules 220_i and as an input capacitor for the power modules 220_j on the sub-mounting surface SB side. This makes it possible to double the effect of input capacitors. Alternatively, the number of capacitors required to obtain the same effect of input capacitors can be decreased to reduce cost.

Example 1-3

Figure 13:
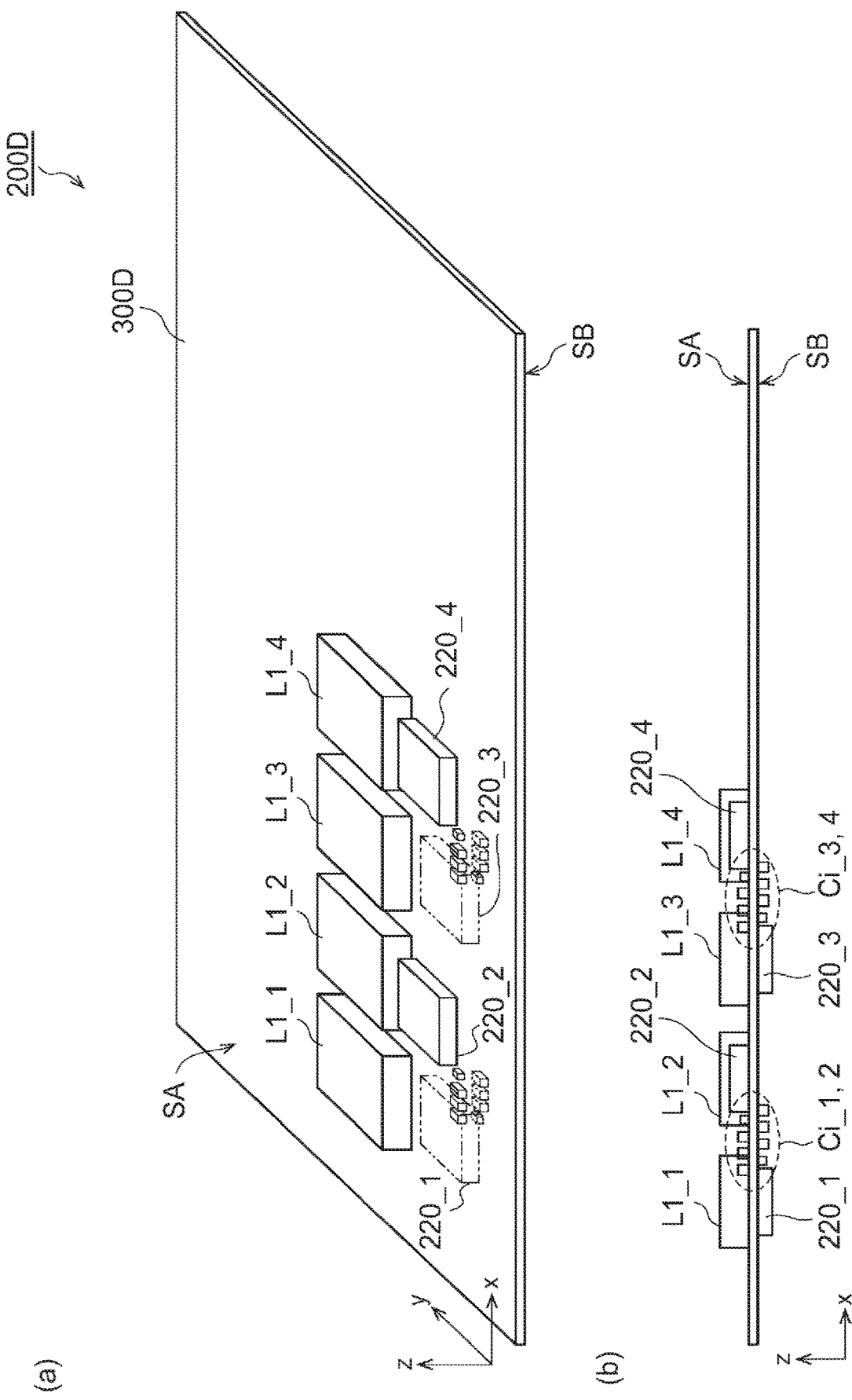
FIGS. 13(a) and 13(b) are layout diagrams illustrating a DC/DC converter according to an example 1-3.

FIGS. 13(a) and 13(b) are layout diagrams illustrating a DC/DC converter 200D according to an example 1-3. In the example 1-3, the chip size of inductors used in the example 1-2 is reduced. In the case of an application where a small current flows to the inductors L1, it is possible to select components with a small allowable current, that is, components having a small chip size, and thus reduce the area occupied by the components.

Example 1-4

Figure 14:
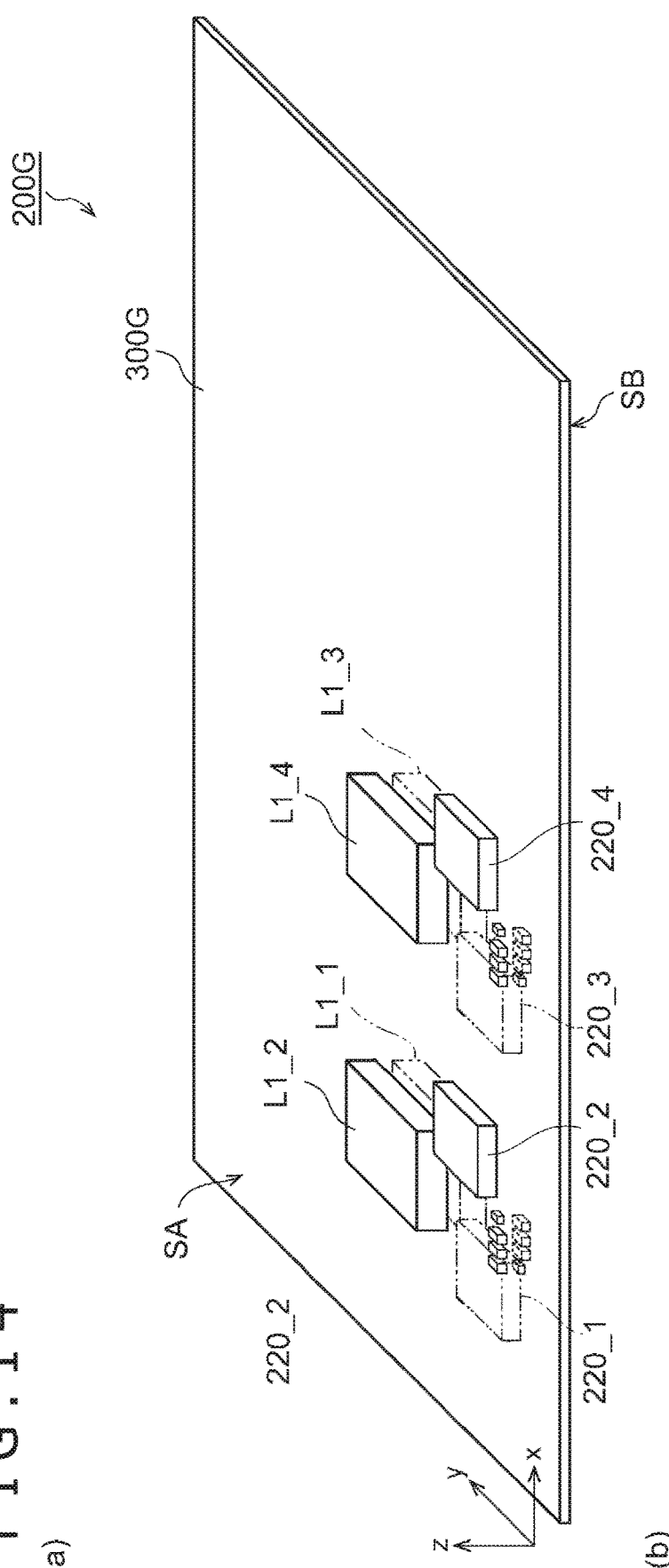
FIGS. 14(a) and 14(b) are layout diagrams illustrating a DC/DC converter according to an example 1-4.

FIGS. 14(a) and 14(b) are layout diagrams illustrating a DC/DC converter 200G according to an example 1-4. In the example 1-4, the layout of inductors used in the example 1-3 is changed. More specifically, the inductors L1_i in the example 1-4 are mounted on the same surface as the corresponding power modules 220_i. Consequently, the inductors L1_i can be connected to the corresponding power modules 220_i with a low impedance.

More preferably, a pair of inductors L1_1 and L1_2 is mounted in an overlap manner on both surfaces SA and SB of a printed circuit board 300G. Further, a pair of inductors L1_3 and L1_4 is mounted in an overlap manner on both surfaces SA and SB of the printed circuit board 300G. This makes it possible to enlarge the intervals between adjacent inductors and alleviate thermal concentration as compared with the layout depicted in FIGS. 13(a) and 13(b).

Second Embodiment

As described in conjunction with the example 1-3, the chip size can be reduced in the case of an application where a small coil current flows to the inductors L1. However, in the case of an application where a large coil current flows to the inductors L1, there is no choice but to select components with a large allowable current, that is, components having a large chip size. Therefore, the size occupied by a DC/DC converter is limited by the chip size of the inductors. A second embodiment is described below by explaining a technology for reducing the size occupied by the DC/DC converter in the case of an application where a large coil current flows.

Figure 15:
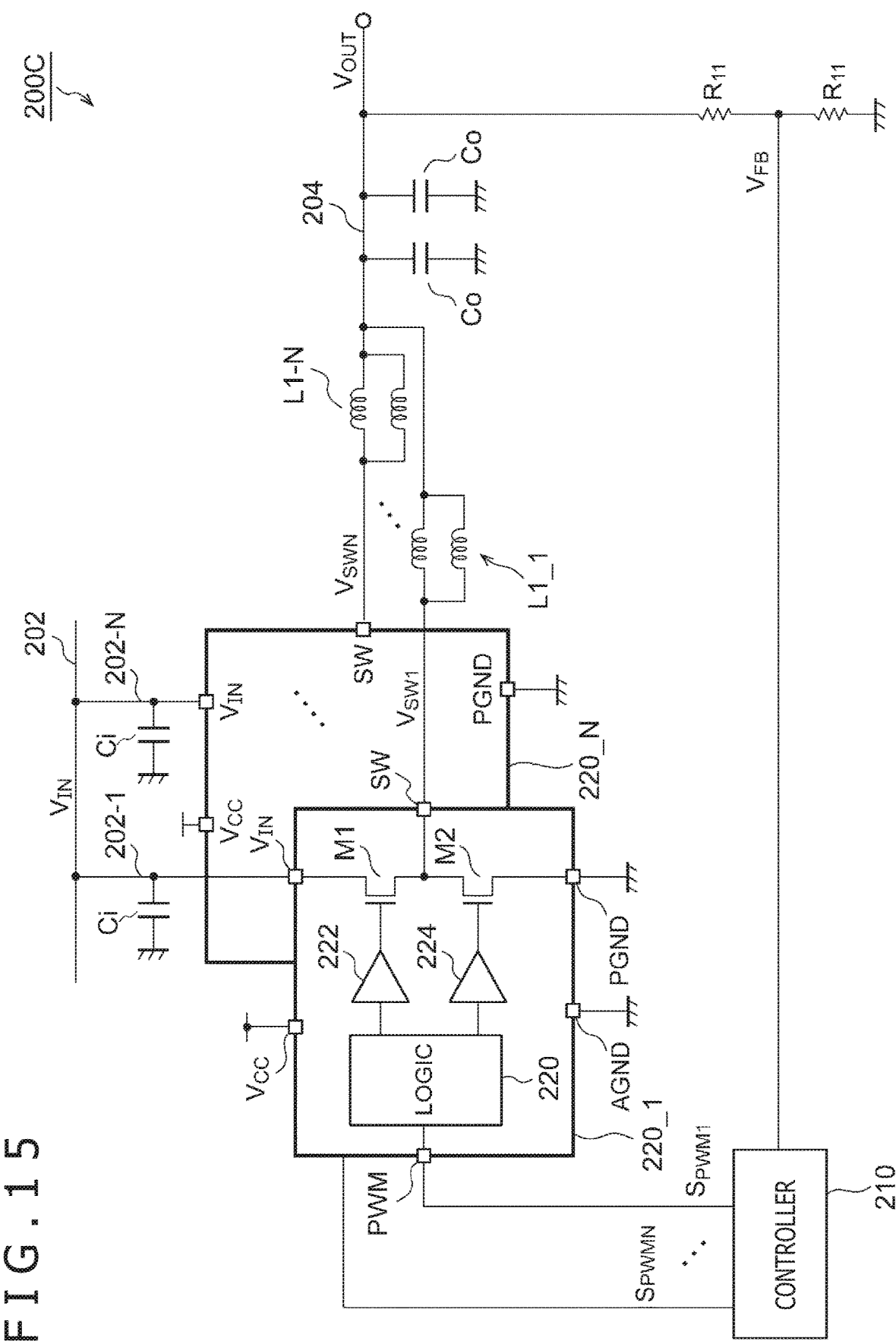
FIG. 15 is an equivalent circuit diagram illustrating a DC/DC converter according to a second embodiment.

FIG. 15 is an equivalent circuit diagram illustrating a DC/DC converter 200C according to the second embodiment. In the DC/DC converter 200C, the inductors L1_# (#=1, 2, . . . , N) are each formed by parallelly connecting two inductor chips L1_#a and L1_#b that are identical in inductance value and in chip size.

The inductance value of two parallelly connected inductor chips is ½ times the inductance value of a single inductor chip. Meanwhile, the amount of current flowing to two parallelly connected inductor chips is ½ times the amount of current flowing to a single inductor chip. In the second embodiment, inductor chips having a small current capacity, namely, inductor chips having a small package size, can be selected by reducing the amount of current flowing per chip. For example, in a case where a single 10-mm-square inductor chip is to be adopted, the technical idea of the second embodiment can be introduced to adopt two parallelly connected 6-mm-square inductor chips instead of the single 10-mm-square inductor chip.

When a product on which the DC/DC converter 200 is mounted is to be mass-produced, it is necessary to consider the availability of chip parts. Particularly, in a case where the product is to be mass-produced and sold for a long period of time, the chip parts need to be steadily supplied for the long period of time. At present, the chip parts are progressively reduced in size, and a wider variety of small-size inductor chips are produced. On the other hand, the availability of large-size chip parts is reduced. In this respect, the problem of availability can be solved by replacing a conventionally adopted inductor having a large chip size with a plurality of parallelly connected inductor chips having a small chip size.

Example 2-1

FIGS. 16(a) and 16(b) are layout diagrams illustrating the DC/DC converter 200C according to an example 2-1. FIG. 16(a) presents a perspective view, and FIG. 16(b) presents a cross-sectional view.

The two inductor chips L1_#a and L1_#b which are electrically connected in parallel to each other are mounted in an overlap manner on the main mounting surface SA and sub-mounting surface SB of a printed circuit board 300C.

In the example 2-1, the N power modules 220_1 to 220_N are mounted alternately on the main mounting surface SA and the sub-mounting surface SB, as is the case with the example 1-2 of the first embodiment.

FIG. 17 is a diagram illustrating a wiring pattern of the DC/DC converter 200C according to the example 2-1. A length (total width) W of an area occupied by the DC/DC converter in an X direction is predominantly limited by a width w of inductor chips. More specifically, W=w×N+s×(N−1), where s represents the intervals between the inductor chips in the x direction. If, for example, 10-mm-square inductor chips are replaced with 6-mm-square inductor chips in a case where N=4, the total width of the area occupied by the DC/DC converter can be reduced by approximately 4 m×4=16 mm.

Further, the example 2-1 provides the same advantages as the example 1-2. That is, it is possible to use a common input line for two adjacent phases and additionally use a common input capacitor Ci_i, j for the two adjacent phases.

Example 2-2

FIGS. 18(a) and 18(b) are layout diagrams illustrating a DC/DC converter 200E according to the example 2-2. FIG. 18(a) presents a perspective view, and FIG. 18(b) presents a cross-sectional view. The example 2-2 is similar to the example 1-1 in FIGS. 6(a) and 6(b) in that a plurality of power modules 220_1 to 220_4 are mounted on the sub-mounting surface SB. Although not depicted in FIGS. 18(a) and 18(b), the input capacitors Ci should be mounted on the sub-mounting surface SB as is the case with the example 1-1.

As is the case with the example 2-1, the example 2-2 makes it possible to reduce the area occupied by the DC/DC converter 200E.

Example 2-3

Figure 19:
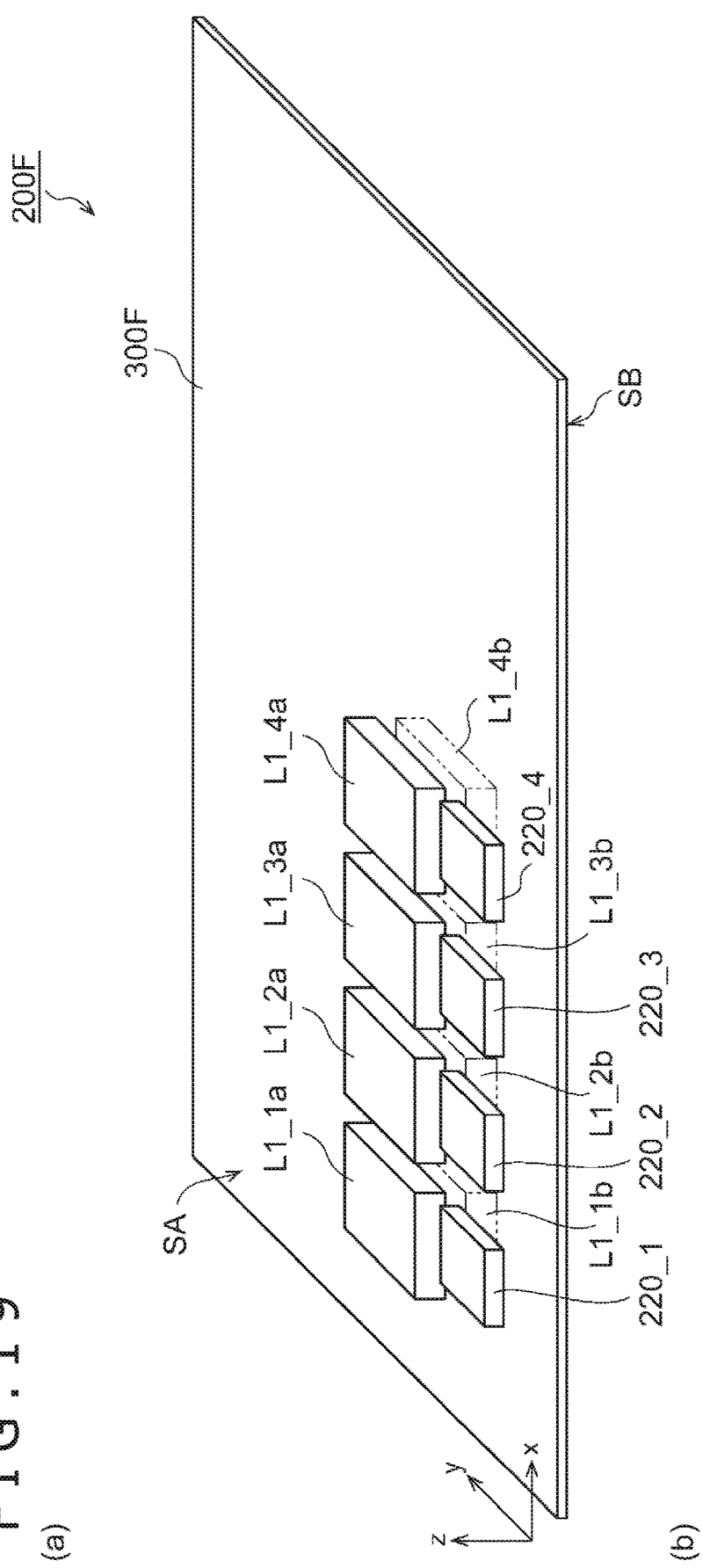
FIGS. 19(a) and 19(b) are layout diagrams illustrating a DC/DC converter according to an example 2-3.
Figure 20:
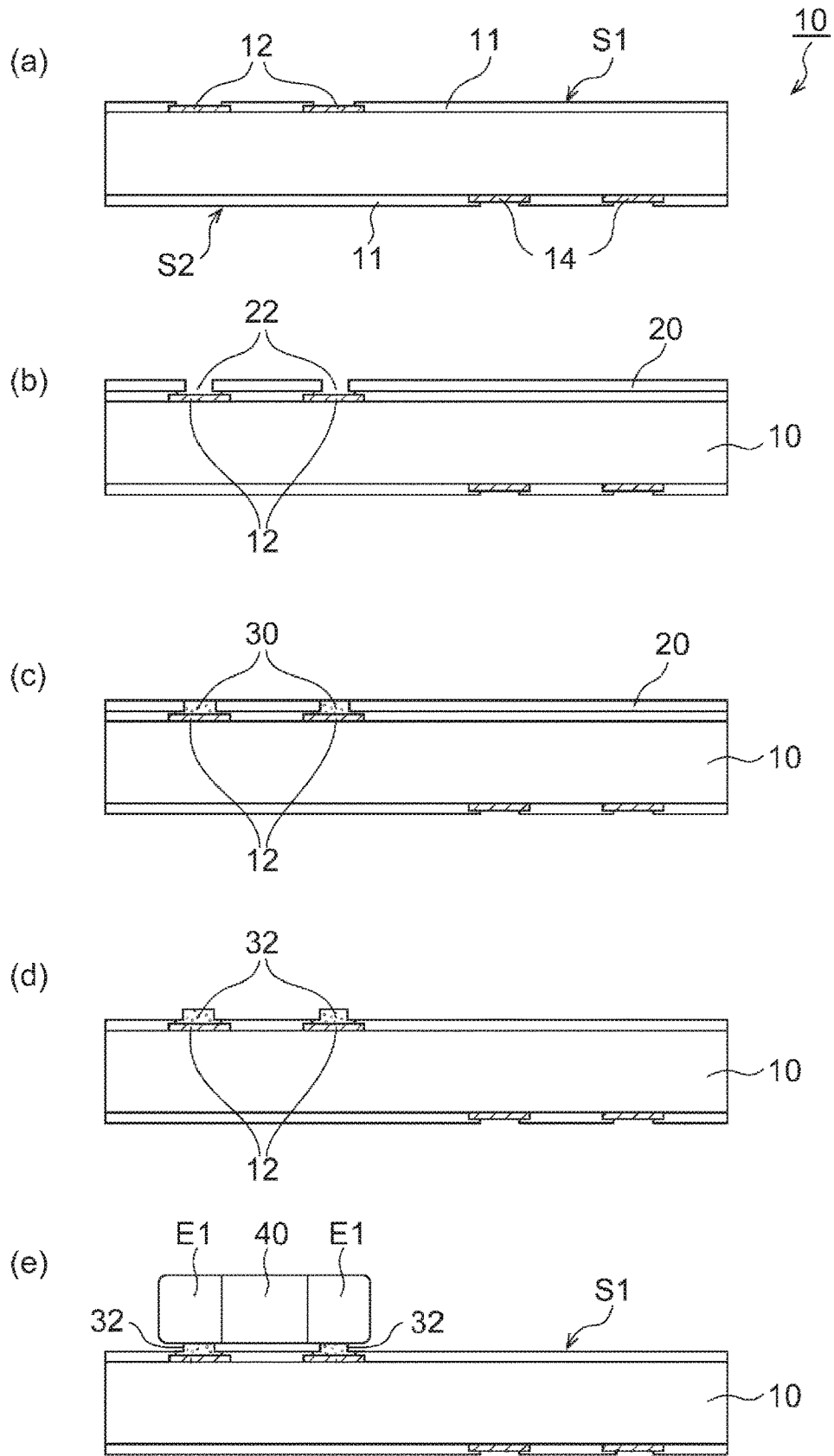
FIGS. 20(a) to 20(e) are cross-sectional views illustrating an electronic equipment assembly process.

FIGS. 19(a) and 19(b) are layout diagrams illustrating a DC/DC converter 200F according to an example 2-3. FIG. 19(a) presents a perspective view, and FIG. 19(b) presents a cross-sectional view. In the example 2-3, the plurality of power modules 220_1 to 220_4 are all mounted on the main mounting surface SA.

As is the case with the examples 2-1 and 2-2, the example 2-3 makes it possible to reduce the area occupied by the DC/DC converter 200F.

Modification 2-1

In the examples 2-1 to 2-3, the inductors L1 for each phase are formed by parallelly connecting two inductor chips. However, the number of inductor chips is not limited to two. The inductors L1 for each phase may alternatively be formed by parallelly connecting three or more inductor chips.

(Mounting Technology)

The technology for mounting the power modules 220 will next be described. Referring to FIG. 1, the DC/DC converter 200 is preferably configured such that the inductor component and resistance component of the input lines 202 are as small as possible. Further, the PGND pin is preferably grounded with as low an impedance as possible. As depicted in FIGS. 5 and 7, the pad (land) for soldering the VIN pin is formed on the first pattern wirings PTN1, and the pad (land) for soldering the PGND pin is formed on the second pattern wiring PTN2. The multilayer wirings are adopted with a large number of via holes provided in order to reduce the impedances of the pattern wirings PTN1 and PTN2. However, in order to keep the impedances as low as possible, it is necessary to form via holes in the pads (lands). These via holes are referred to as in-pad vias.

When the comparative technology depicted in FIG. 5, the power modules 220 are mounted only on the main mounting surface. Therefore, there is no particular difficulty in forming the in-pad vias. However, in the examples 1-1, 1-2, 1-3, 2-1, and 2-2, the in-pad vias need to be formed on the sub-mounting surface because the power modules 220 are mounted on the sub-mounting surface. If no considerations of the costs are made, it is not impossible to form the in-pad vias on the sub-mounting surface. However, when considerations of the costs are given, the in-pad vias will not easily be formed on the sub-mounting surface by using a conventional surface-mount technology. Therefore, a surface-mount technology that is capable of forming in-pad vias on the sub-mounting surface will hereinafter be described.

First of all, problems arising when the in-pad vias are mounted on the sub-mounting surface will be described with reference to FIGS. 20 to 23.

Electronic equipment includes a printed circuit board and electronic components mounted on the printed circuit board. In recent years, mainstream electronic components are surface-mounted devices (SMDs (Surface Mount Devices)) such as chip inductors, chip resistors, chip capacitors, and transistors.

FIGS. 20(a) to 20(e) and FIGS. 21(a) to 21(e) are cross-sectional views illustrating an electronic equipment assembly process. FIG. 20(a) depicts a printed circuit board 10 on which components are not yet mounted. On a first surface (preceding mounting surface) S1 and a second surface (succeeding mounting surface) S2 of the printed circuit board 10, a printed wiring (not depicted) and pads (lands) 12 and 14 are formed. The pads 12 and 14 are disposed at places corresponding to those of electrodes of components, and a portion other than the pads 12 and 14 is covered with a resist 11.

As depicted in FIG. 20(b), a screen (referred to also as a metal mask or a solder mask) 20 is placed on the first surface S1. The screen 20 has an opening 22 that is positioned to overlap the pad 12 disposed on the first surface S1 side. Subsequently, as depicted in FIG. 20(c), solder cream (solder paste) 30 is applied from above the screen 20. When the screen 20 is removed as depicted in FIG. 20(d), solder cream 32 is left only on the pad 12.

Next, as depicted in FIG. 20(e), a component 40 is mounted on the first surface S1 by using a mounter. The solder cream 32 is sandwiched between electrodes E1 and E2 of the component 40 and the pad 12. In this state, a reflow process is performed, so that the component 40 is electrically and mechanically connected to the circuit board 10.

Next, mounting of components on the second surface S2 is described. As depicted in FIG. 21(a), the printed circuit board 10 is inverted such that the second surface S2 faces upward. As depicted in FIG. 21(b), a screen 50 is then placed on the second surface S2. The screen 50 has an opening 52 that is positioned to overlap the pad 14 disposed on the second surface S2 side. Subsequently, as depicted in FIG. 21(c), solder cream 60 is applied from above the screen 50. When the screen 50 is removed as depicted in FIG. 21(d), solder cream 62 is left only on the pad 14.

Then, as depicted in FIG. 21(e), a component 70 is mounted on the second surface S2 by using a mounter. The solder cream 62 is sandwiched between electrodes E1 and E2 of the component 70 and the pad 14. In this state, the reflow process is performed, so that the component 70 is electrically and mechanically connected to the circuit board 10. Surface mounting is as described above.

As a result of studies conducted on surface mounting, the inventors of the present invention have recognized the following problems with surface mounting. The printed circuit board 10 includes a plurality of wiring layers, and different wiring layers are connected to one another through vias. The vias are usually disposed apart from pads. In some cases, however, the vias are disposed in the pads in order to improve heat dissipation or reduce parasitic impedance. The vias disposed in the pads are referred to as in-pad vias.

According to a conventional surface-mount technology, it is difficult to form in-pad vias on the first surface S1, which is a preceding mounting surface. FIGS. 22(a) to 22(e) are diagrams illustrating mounting of a component on the first surface S1. FIGS. 23(a) to 23(e) are diagrams illustrating mounting of a component on the second surface S2.

FIG. 22(a) depicts a printed circuit board 10A on which components are not yet mounted. A pad (land) 16 and an in-pad via 17 are formed on the first surface (preceding mounting surface) S1 of the printed circuit board 10A.

The screen 20 is placed on the first surface S1 (FIG. 22(b)), and then, the solder cream 30 is applied from above the screen 20 (FIG. 22(c)). Subsequently, when the screen 20 is removed, the solder cream 32 is left on the pad 16 (FIG. 22(d)).

Next, a component 40A is mounted on the first surface S1 by using a mounter (FIG. 22(e)). The component 40A has a back-surface electrode E3. The solder cream 32 is sandwiched between the back-surface electrode E3 and the pad 16. In this state, the reflow process is performed, so that the component 40A is electrically and mechanically connected to the circuit board 10. In this process, part of the solder cream 32 penetrates through the in-pad via 17 (through-hole) and leaks out from the second surface S2 side. The solder leakage 34 causes mounting failure as described below.

Mounting of components on the second surface S2 is described below with reference to FIGS. 23(a) to 23(e). As depicted in FIG. 23(a), the printed circuit board 10A is inverted such that the second surface S2 faces upward. Next, as depicted in FIG. 23(b), the screen 50 is placed on the second surface S2. The screen 50 has the opening 52 that is positioned to overlap the pad 14.

Subsequently, as depicted in FIG. 23(c), the solder cream 60 is applied from above the screen 50. FIG. 23(d) depicts a state where the screen 50 is removed. The solder cream 62 is applied to an unintended area other than the pad 14. When the component 70 is mounted on the second surface S2 in this state and then subjected to the reflow process, the pads 14 adjacent to each other may cause a short circuit or other malfunctions due to the solder cream 62.

The above-described problems may occur due to the use of the conventional surface-mount technology. In a case where in-pad vias are to be formed on the preceding mounting surface, it is conceivable that mounting of components on the second surface may be performed by selectively applying solder cream to the pad 14 through the use of a needle dispenser without using a screen-printing process. This method makes it possible to mount components on the second surface S2 while avoiding the influence of the solder cream 30 on the first surface S1. However, application of solder cream with the needle dispenser results in significantly lower throughput than that when the screen-printing process is performed for application of solder cream. Therefore, application of solder cream should not be performed with the needle dispenser in a case where a large number of components are to be mounted on the second surface S2.

As another approach, it is conceivable that via holes are filled beforehand with metal or resin to close the holes in a process of manufacturing the printed circuit board 10A. Adopting this approach makes it possible to prevent the solder cream 30 from leaking into the second surface S2 side in a process depicted in FIG. 22(e). However, using this solution increases the number of steps required for manufacturing the printed circuit board 10A. As a result, an increase occurs in the cost of the printed circuit board 10A.

Figure 24:
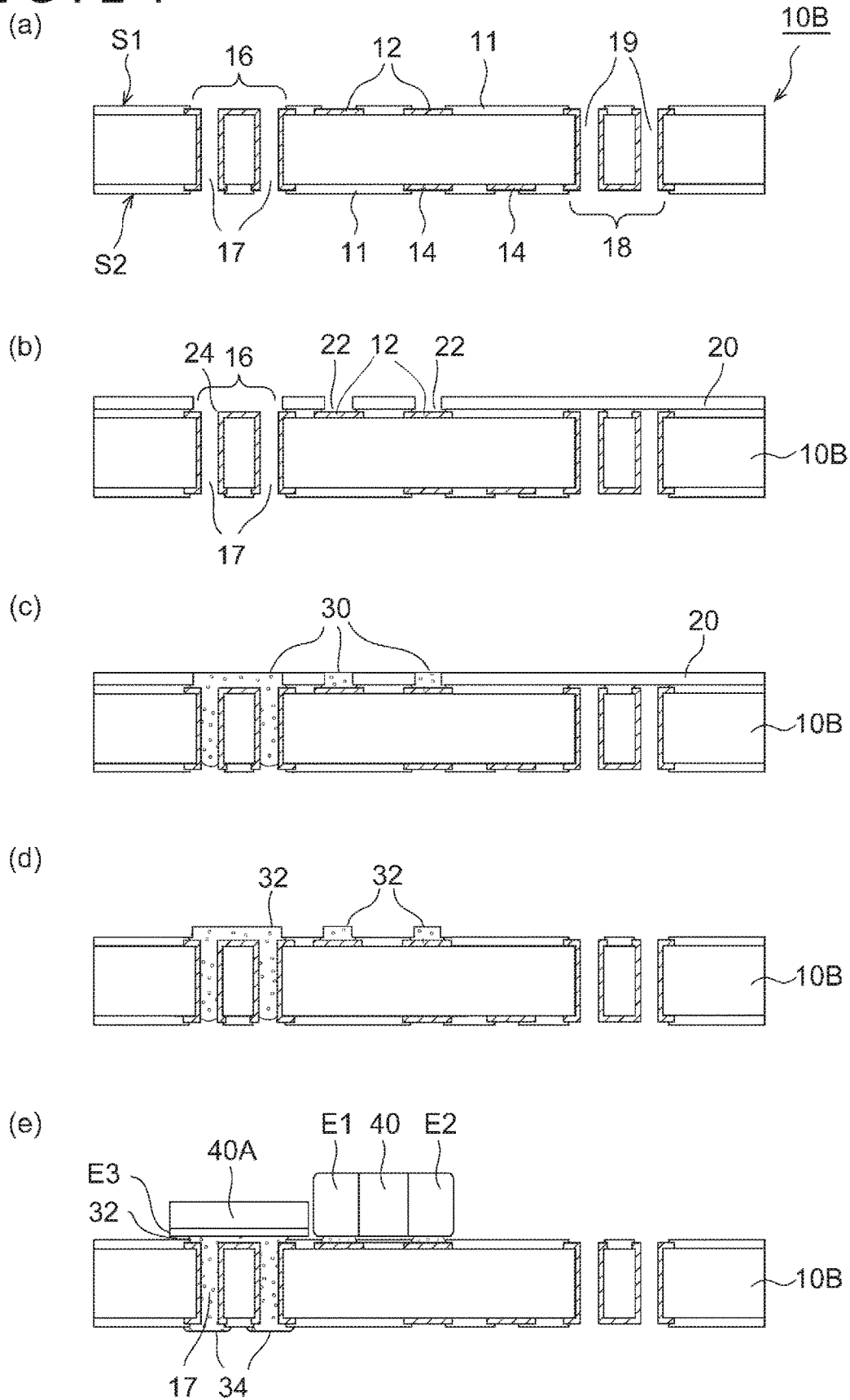
FIGS. 24(a) to 24(e) are diagrams illustrating an electronic equipment manufacturing method according to an embodiment.
Figure 25:
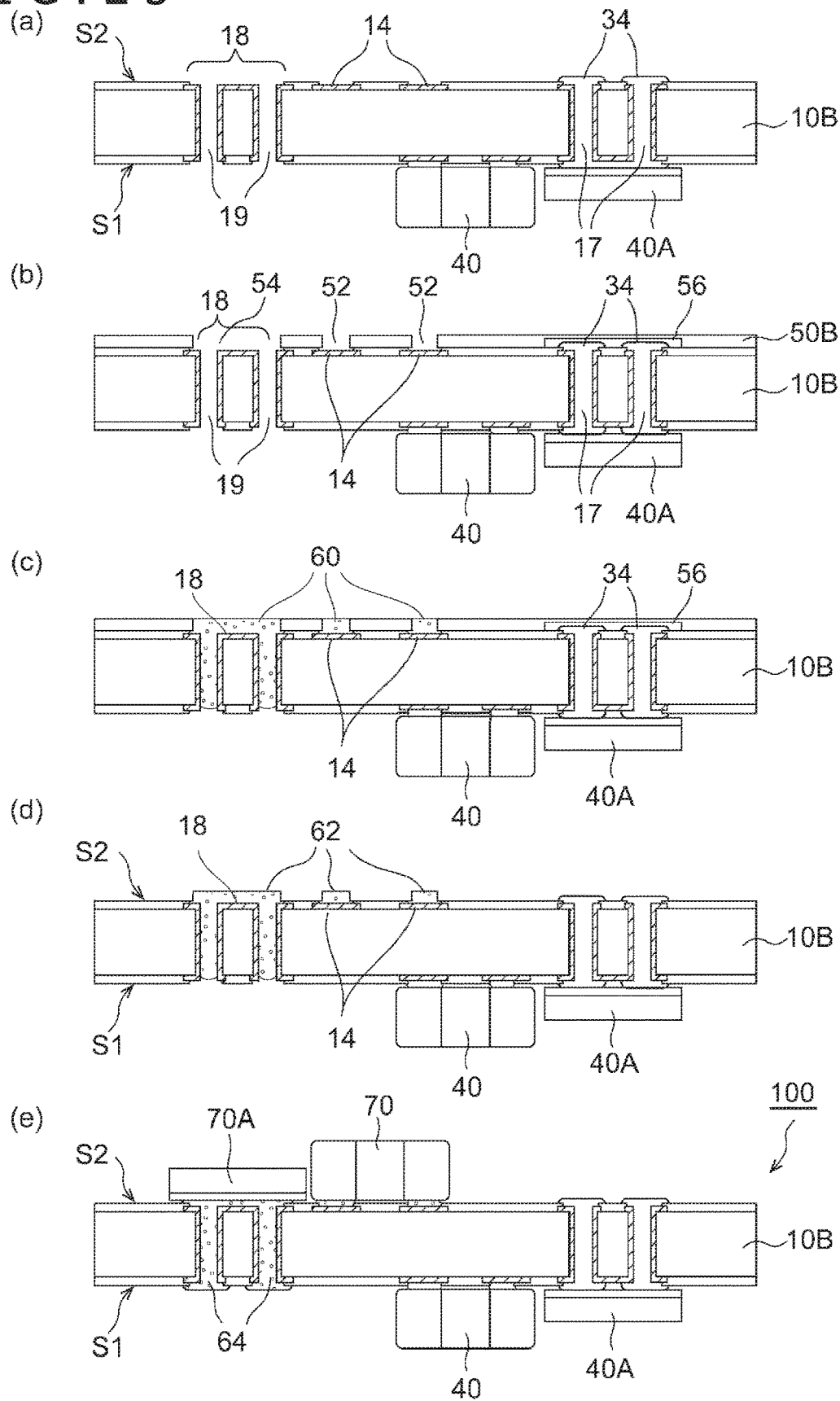
FIGS. 25(a) to 25(e) are diagrams illustrating the electronic equipment manufacturing method according to the embodiment.

The mounting technology that makes it possible to solve the above-described problems will be described below with reference to FIGS. 24 and 25.

FIGS. 24(a) to 24(e) and FIGS. 25(a) to 25(e) are diagrams illustrating an electronic equipment manufacturing method according to an embodiment. FIGS. 24(a) to 24(e) and FIGS. 25(a) to 25(e) depict an assembly process performed by surface mounting.

Mounting of components on a first surface S1 will now be described with reference to FIGS. 24(a) to 24(e). Mounting on the first surface S1 is substantially similar to mounting depicted in FIGS. 22(a) to 22(e), as described below.

FIG. 24(a) depicts a printed circuit board 10B on which components are not yet mounted. Some pads (lands) 12 and 16 are formed on the first surface (preceding mounting surface) S1 of the printed circuit board 10B. The in-pad via 17 is formed in the pad 16. Some pads 14 and 18 are similarly formed on a second surface (succeeding mounting surface) S2 of the printed circuit board 10B. An in-pad via 19 is formed in the pad 18.

As depicted in FIG. 24(b), a screen 20 is placed on the first surface S1. The screen 20 has openings 22 and 24 that are disposed at positions corresponding to those of the pads 12 and 16. Subsequently, solder cream 30 is applied from above the screen 20 (FIG. 24(c)).

Next, when the screen 20 is removed, solder cream 32 is left on the pads 12 and 16 (FIG. 24(d)).

Subsequently, components 40 and 40A are mounted on the first surface S1 by using a mounter (FIG. 24(e)). The solder cream 32 is sandwiched between electrodes E1 and E2 of the component 40 and the pad 12. The component 40A has a back-surface electrode E3, and the solder cream 32 is sandwiched between the back-surface electrode E3 and the pad 16. In this state, a reflow process is performed, so that the component 40A is electrically and mechanically connected to the circuit board 10.

In the above process, part of the solder cream 32 penetrates through the in-pad via 17 (through-hole) and leaks out from the second surface S2 side.

Next, mounting of components on the second surface S2 will be described with reference to FIGS. 25(a) to 25(e). As depicted in FIG. 25(a), the printed circuit board 10B is inverted such that the second surface S2 faces upward. Next, as depicted in FIG. 25(b), a screen 50B is placed on the second surface S2.

In the present embodiment, the screen 50B has the opening 52 that is positioned to overlap the pad 14. Additionally, a recess 56 disposed to overlap the in-pad via 19 is formed on the screen 50B. The recess 56 prevents the screen 50B from interfering with solder leakage 34 and makes it possible to bring the screen 50B into close contact with the second surface S2.

FIG. 25(d) depicts a state where the screen 50B is removed. The solder cream 62 is applied to only the pads 14 and 18 and inhibited from excessively protruding from the pads 14 and 18.

Subsequently, as depicted in FIG. 25(e), components 70 and 70A are mounted on the second surface S2 and then subjected to the reflow process. This causes the electrodes E1 and E2 of the component 70 to be electrically and mechanically connected to the pad 14 and causes the back-surface electrode E3 of the component 70A to be electrically and mechanically connected to the pad 18. A semiconductor device 100 is assembled in the above-described manner.

The semiconductor device manufacturing method according to the embodiment is as described above.

As described above, according to the present embodiment, in order to avoid interference with the solder leakage 34, the recess 56 is formed on the screen 50B which is used when the solder cream is applied to the second surface S2. This makes it possible to avoid positional displacement of the screen 50B due to the solder leakage 34 and prevent the solder cream 60 from entering the gap between the screen 50B and the second surface S2.

It should be noted that solder leakage 64 may occur on the first surface S1 side through the in-pad via 19 when the component 70A is mounted on the second surface S2. However, such solder leakage 64 does not exert an adverse effect because mounting of components on the first surface S1 is already completed.

The present invention has been described in terms of the embodiments. The embodiments are illustrative and not restrictive. It should be understood by persons skilled in the art that the combination of the component elements and processes of the embodiments can be variously modified and that such modifications are also within the scope of the present invention.

INDUSTRIAL APPLICABILITY

The present invention relates to a power source device.

REFERENCE SIGNS LIST

10: Printed circuit board
12, 14, 16: Pad
17: In-pad via
18: Pad
19: In-pad via
S1: First surface
S2: Second surface
20: Screen
22: Opening
30: Solder cream
32: Solder cream
34: Solder leakage
40: Component
E1, E2: Electrode
E3: Back-surface electrode
50: Screen
52, 54: Opening
56: Recess
60: Solder cream
70: Component
100: Semiconductor device
200: DC/DC converter
202: Input line
204: Output line
210: Controller
220: Power module
M1: High-side transistor
M2: Low-side transistor
L1: Inductor
Ci: Input capacitor
Co: Output capacitor
222: High-side driver
224: Low-side driver
226: Logic circuit
240: Heat sink
300: Printed circuit board
SA: Main mounting surface
SB: Sub-mounting surface
PTN1: First pattern wiring
PTN2: Second pattern wiring
PTN3: Third pattern wiring
PTN4: Fourth pattern wiring

The invention claimed is:

1. A power source device comprising:
an input line that receives a supply of a direct-current input voltage;
an output line that is connected to a load;
N inductors that correspond to N phases and each have one end connected to the output line, where N is an integer greater than zero; and
N power modules that correspond to the N phases and each have a switching pin connected to another end of a corresponding inductor, wherein
the N inductors each include a plurality of inductor chips that are electrically connected in parallel to each other, and the plurality of inductor chips are mounted separately on a main mounting surface and a sub-mounting surface of a printed circuit board, the sub-mounting surface being opposite to the main mounting surface,
wherein at least two inductor chips are used as the plurality of inductor chips and are mounted opposite one another, in an overlap manner, on the main mounting surface and the sub-mounting surface, respectively, and
wherein at least two of the N power modules, each associated with a respective one of the at least two inductor chips, are mounted in a non-overlap manner, on the main mounting surface and the sub-mounting surface, respectively.

2. The power source device according to claim 1, wherein at least one of the N power modules is mounted on the sub-mounting surface.

3. The power source device according to claim 1, wherein the N inductors are linearly arranged in a first direction, and
an i-th (i=1 to N) power module is disposed adjacently in a second direction to a corresponding i-th inductor, the second direction being perpendicular to the first direction.

4. The power source device according to claim 3, wherein the N power modules are all mounted on the sub-mounting surface, except for the at least two of the N power modules.

5. The power source device according to claim 3, wherein the N power modules are mounted alternately on the main mounting surface and the sub-mounting surface.

6. The power source device according to claim 5, wherein respective pairs of the N power modules are connected to a respective common input line.

* * * * *